United States Patent
Dasgupta et al.

(10) Patent No.: US 11,377,734 B2
(45) Date of Patent: Jul. 5, 2022

(54) TRANSPARENT NANOWIRE ARCHITECTURES FOR MARINE ANTI-FOULING

(71) Applicant: THE REGENTS OF THE UNIVERSITY OF MICHIGAN, Ann Arbor, MI (US)

(72) Inventors: Neil P. Dasgupta, Ann Arbor, MI (US); Jing Wang, Ann Arbor, MI (US); Anish Tuteja, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 17/182,791

(22) Filed: Feb. 23, 2021

(65) Prior Publication Data

US 2021/0262089 A1    Aug. 26, 2021

Related U.S. Application Data

(60) Provisional application No. 62/981,178, filed on Feb. 25, 2020.

(51) Int. Cl.
| | |
|---|---|
| *B63B 59/04* | (2006.01) |
| *C23C 16/455* | (2006.01) |
| *C23C 16/40* | (2006.01) |
| *C23C 16/56* | (2006.01) |
| *C23C 28/02* | (2006.01) |
| *B82Y 30/00* | (2011.01) |
| *B82Y 35/00* | (2011.01) |

(52) U.S. Cl.
CPC ........ *C23C 16/45534* (2013.01); *B63B 59/04* (2013.01); *C23C 16/405* (2013.01); *C23C 16/407* (2013.01); *C23C 16/45553* (2013.01); *C23C 16/56* (2013.01); *C23C 28/02* (2013.01); *B82Y 30/00* (2013.01); *B82Y 35/00* (2013.01)

(58) Field of Classification Search
CPC ...... B05D 5/08; B05D 5/086; C03C 2217/76; B63B 59/04; C23C 16/45553
See application file for complete search history.

(56) References Cited

U.S. PATENT DOCUMENTS

| | | | |
|---|---|---|---|
| 2006/0240218 A1* | 10/2006 | Parce ................... | B82Y 30/00 428/98 |
| 2008/0241512 A1* | 10/2008 | Boris ................... | B05D 1/60 427/180 |
| 2014/0011013 A1* | 1/2014 | Jin ....................... | B05D 5/08 438/57 |

* cited by examiner

*Primary Examiner* — Tabassom Tadayyon Eslami
(74) *Attorney, Agent, or Firm* — Harness, Dickey & Pierce, P.L.C.

(57) ABSTRACT

A rational design and fabrication of $ZnO/Al_2O_3$ core-shell nanowire architectures with tunable geometries (length, spacing, branching) and surface chemistry is provided. The fabricated nanowires significantly delay or even prevent marine biofouling. In some embodiments, hydrophilic nanowires can reduce the fouling coverage by up to approximately 60% after 20 days compared to planar control surfaces. The mechanism of the fouling reduction is mainly due to two geometric effects: reduced effective settlement area and mechanical cell penetration. Further, superhydrophobic nanowires can completely prevent marine algal fouling for up to 22 days. Additionally, the developed nanowire surfaces are transparent across the visible spectrum, making them applicable to windows and oceanographic sensors.

9 Claims, 19 Drawing Sheets

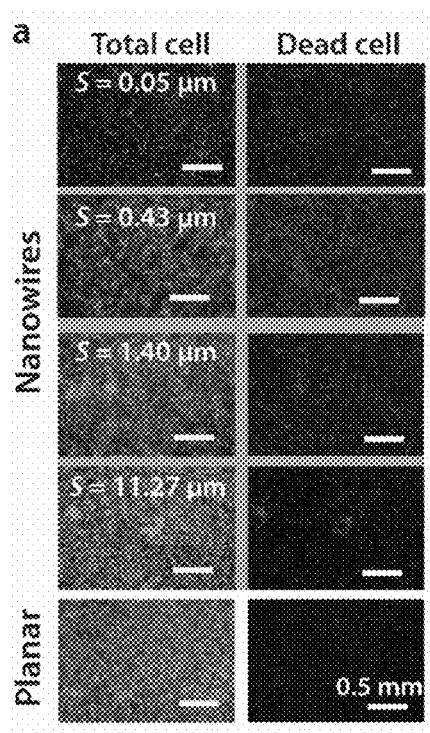
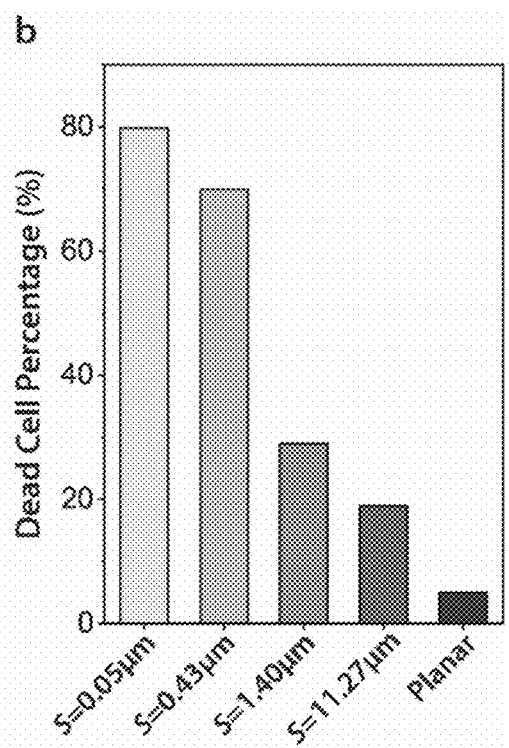
FIG. 8A  FIG. 8B

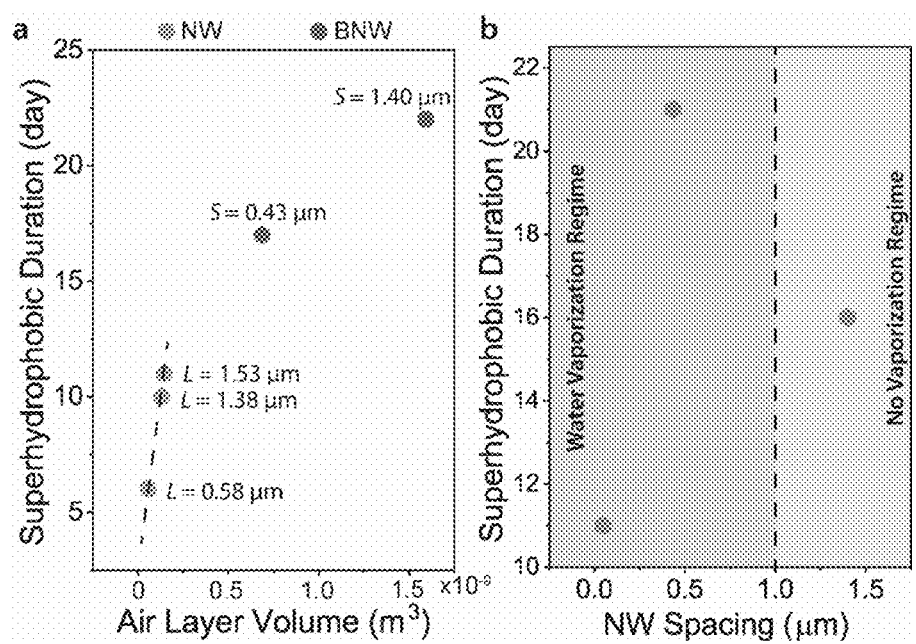
FIG. 10A  FIG. 10B

TRANSPARENT NANOWIRE ARCHITECTURES FOR MARINE ANTI-FOULING

CROSS-REFERENCE TO RELATED APPLICATIONS

This application claims the benefit of U.S. Provisional Application No. 62/981,178, filed on Feb. 25, 2020. The entire disclosure of the above application is incorporated herein by reference.

GOVERNMENT SUPPORT

The invention is made with government support under 18AP00066 awarded by Defense Advanced Research Projects Agency (DARPA) and 1751590 awarded by the National Science Foundation (NSF). The government has certain rights in the invention.

FIELD

The present disclosure relates to marine anti-fouling solutions and, more particularly, to a transparent nanowire architecture for marine anti-fouling.

BACKGROUND AND SUMMARY

This section provides background information related to the present disclosure which is not necessarily prior art. This section provides a general summary of the disclosure, and is not a comprehensive disclosure of its full scope or all of its features.

Marine biofouling is a global problem that hinders maritime industry and results in increased fuel consumption from added drag, safety concerns from corrosion, and attenuation of sensor signals. The economic penalty from marine biofouling is significant costing the aquaculture and shipping industries billions of dollars per year in maintenance and increased fuel consumption.

To overcome these problems, the present teachings provide a method of and system for patterning surfaces with nanoscale textures that prevent or at least significantly inhibit marine fouling. The present teachings further provide these benefits while maintaining optical transparency.

To arrive at the present solution, a variety of toxic marine paints and non-toxic micro-scale surface structures has been explored for their anti-biofouling properties. In particular, micro-scale surface structures inspired by marine species surface have been intensively explored for repelling the fouling of single marine species. However, examples of anti-biofouling performance on surface architectures with characteristic length-scales spanning from below 100 nm to greater than 10 μm are generally lacking, particularly under multi-species fouling environments. One of the challenges that has impeded systematic studies of marine biofouling at these length-scales is the limitation of nano-fabrication processes that can tune the geometry of surface structures on a variety of non-planar substrates in a scalable manner. Most current fabrication methods for creating controlled nanoscale architectures depend on patterning processes (e.g., lithography), which are restricted in their substrate compatibility, scalability, and cost. Alternative patterning and deposition methods (e.g., self-assembly) provide precise control of periodic geometries; however, the ability to decouple independent geometric parameters in 3-dimensions (length, spacing, aspect ratio) is challenging.

According to the principles of the present teachings, nanowire (NW) architectures for preventing marine algal fouling are provided. Specifically, the present teachings provide disclosure relating to the rational design and systematic control of nanowire architectures with tunable geometric parameters (length, spacing, branching) at length-scales spanning from tens of nanometers to ten micrometers. The coupled effects of surface geometry and chemistry on marine algal fouling in a multi-species environment are identified. Specifically, it has been found that NW structures alone (geometry effect) can delay algal biofouling for approximately 15 days, reduce the surface coverage of fouling by up to approximately 60% after one month, and maintain optical transparency compared to the untreated surfaces.

The mechanism of fouling reduction on hydrophilic NWs is attributed to two effects: 1) the NWs reduce the effective contact area to marine algae due to a steric hindrance to cell settlement; and 2) NWs produced a mechanical biocidal effect on settled algae. Further, functionalized NWs that were superhydrophobic (coupled effect of geometry and chemistry) demonstrate complete biofouling prevention for approximately 20 days. The durability of the superhydrophobicity on different NW architectures can be explained through thermodynamic and mass transfer analysis, providing design guidelines for underwater superhydrophobic anti-fouling coatings. In addition, the nanowire architectures are transparent across the visible spectrum, demonstrating their feasibility on windows and optical surfaces.

To demonstrate the potential of this fabrication method for scalable modification of non-planar surfaces, a curved glass surface is under-coated and demonstrated a significant reduction in algal fouling after ten days (FIG. 1). As another iteration of the invention, core-shell NW structures with different functionalization methods were also demonstrated (FIG. 2).

The results of the present teachings have elucidated rational design of anti-marine-fouling coatings at the nanoscale. In addition, the anti-fouling performance of NW surfaces in multi-species algae environments indicates the potential applicability of the present teachings for real-world marine applications. The insights gained from the present teachings can further be applied to other applications (such as selective settlement of marine species on NWs, superhydrophobic duration under algal environment, etc.) to enable cell manipulation, controlled underwater superhydrophobicity, and more.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1 shows a curved watch glass that is coated with NWs in half of the area, confirmed by electron scanning microscope (SEM) imaging. The coated cured glass is further functionalized by F-17 silane. The NW-coated area is superhydrophobic. After emerging in the algae fouling environment for 10 days, the NW-coated area remained clean and the planar control area is covered with green algae.

FIG. 2 is a schematic of the fabrication process and resulting microscopy images of PDMS-functionalized NWs. The NWs are fabricated by Atomic Layer Deposition (ALD) surface directed self-assembly as described herein. After overcoating with anatase $TiO_2$ layer, the NWs were submerged into silicone oil with different viscosities under UV exposure for 20 min, shown in SEM images with 5 nm, 10 nm, and 20 nm $TiO_2$ shells deposited by Atomic Layer Deposition (ALD) on the NW surfaces. Confirmed by transmission electron microscopy (TEM), a ZnO—$TiO_2$ PDMS core-shell-shell NW structure was successfully formed.

FIGS. 3A-3D show fabrication of nanowires with tunable geometries. FIG. 3A shows a scheme of the fabrication process. FIG. 3B shows SEM images of NWs with different length ranging from 0.58 μm to 1.53 μm fabricated using different hydrothermal growth time from 15 min to 105 min.

FIG. 3C shows SEM images of NWs with different inter-NW spacing ranging from 0.05 μm to 11.37 μm. The inter-NW spacing is modulated by changing the number of ALD $TiO_2$ cycles from 0 cycles to 7 cycles. The ALD $TiO_2$ layers were deposited on top of the ZnO seed layers to control nucleation during the subsequent hydrothermal growth process.

FIG. 3D shows hierarchical branched NWs with varying spacing between the base NWs.

FIGS. 4A-4C are an optical characterization on the different nanowire surface fabricated on glass. FIG. 4A is an optical image demonstrating the transparency of these NW surfaces. FIG. 4B is a transmittance spectrum of NWs with different lengths. FIG. 4C is a transmittance spectrum of NWs with different inter-NW spacing and branching.

FIGS. 5A-5C show a contact angle measurement on hydrophobic NWs. FIG. 5A shows schematics illustrating Cassie-Baxter and Wenzel states. FIG. 5B is a contact angle and contact angle hysteresis measurement on unsilanized and silanized NWs with different lengths. FIG. 5C shows contact angle and contact angle hysteresis measurements on unsilanized and silanized NWs with different inter-NW spacings. Error bars were obtained from at least 5 independent measurements.

FIGS. 6A-6D are marine algae fouling on different hydrophilic nanowire surfaces. FIG. 6A shows optical microscopy images comparing NW and planar control surfaces after 20 days of algal fouling. FIG. 6B is an algae coverage area on NWs with different length in the Wenzel state for 50 days. FIG. 6C is an algae coverage area on BNWs in the Wenzel state for 50 days. FIG. 6D is an algae coverage area on NWs with different spacing in the Wenzel state for 50 days. Errors bars were obtained from at least 3 independent measurements.

FIGS. 7A-7C show a size-selective settlement mechanism for fouling reduction on hydrophilic NWs. FIG. 7A show cross-sectional SEM images of NWs with different spacing after fouling for two days. FIG. 7B is a schematic of the spatial variation in fouling rate along the surface of NWs with different spacings. FIG. 7C shows the algal fouling coverage area fraction, which has been normalized by the planar control on NWs with different spacings after 20 days. Errors bars were obtained from at least 3 independent measurements.

FIGS. 8A-8B is the mechanical biocidal effect of hydrophilic NWs. FIG. 8A show fluorescent microscopic images of NWs with different inter-NW spacings after emerging in marine algae culture solution for 5 days. FIG. 8B is a dead/total cell fraction as a function of substrate geometry.

FIGS. 9A-9D show marine algal fouling coverage on superhydrophobic NW surfaces. FIG. 9A shows optical microscopy images for planar and NW surfaces after 20 days of algae fouling. FIG. 9B shows algae coverage area fraction on high-density NWs as a function of NW length for 60 days. FIG. 9C shows algae coverage area fraction on BNWs for 80 days. FIG. 9D shows algae coverage area on NWs with different inter-NW spacings for 80 days. Errors bars were obtained from at least 3 independent measurements.

FIG. 10A-10B show the superhydrophobic duration of NWs in the Cassie state. FIG. 10A shows superhydrophobic duration of NW surfaces with different length and degrees of hierarchy under marine algae fouling conditions. FIG. 10B shows superhydrophobic duration of NW surfaces with different spacing under the marine algae fouling conditions.

FIG. 11 shows scanning electron microscope (SEM) images of cyanobacteria (gray box) and diatoms (green box) on the NWs. A variety of cyanobacteria and diatoms were observed from these SEM images, indicating the multispecies marine fouling environment used.

FIGS. 12A-12C shows fabrication processes of core-shell NWs and BNWs. FIG. 12A shows fabrication processes of NWs with controlled length and spacing. FIG. 12B shows fabrication processed of BNWs. FIG. 12C is a transmission electron microscopy (TEM) image of a core-shell NW.

FIGS. 13A-13B is a haze measurement on different surfaces. FIG. 13A is a haze measurement on NWs with different length (i.e., growth time) compared with the planar control. FIG. 13B haze measurement on NWs with different spacing and levels of hierarchy compared with the planar control.

Figure 16:
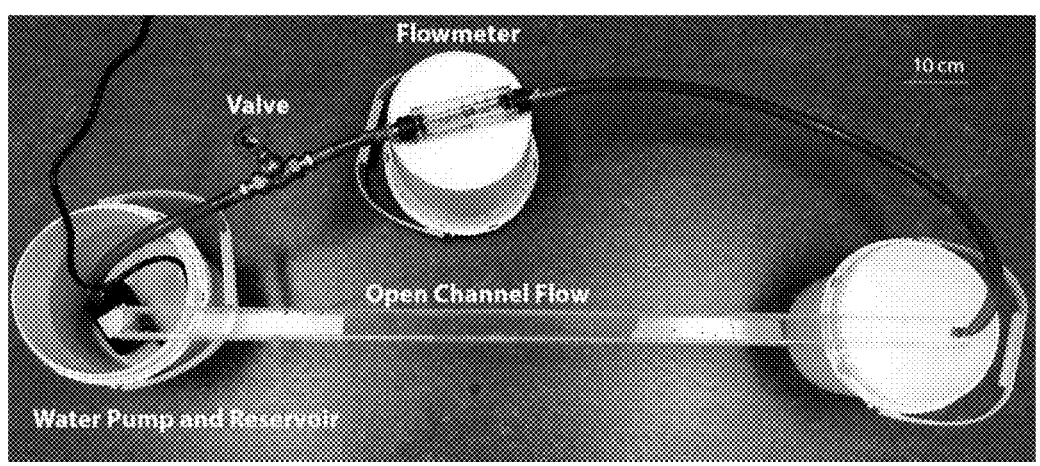

FIG. 16 shows the shear flow setup. Open channel flow composed of water reservoir, pump, valve, flowmeter, and the flow channel. The flow rate is 0 to 2 gpm.

Figure 17:
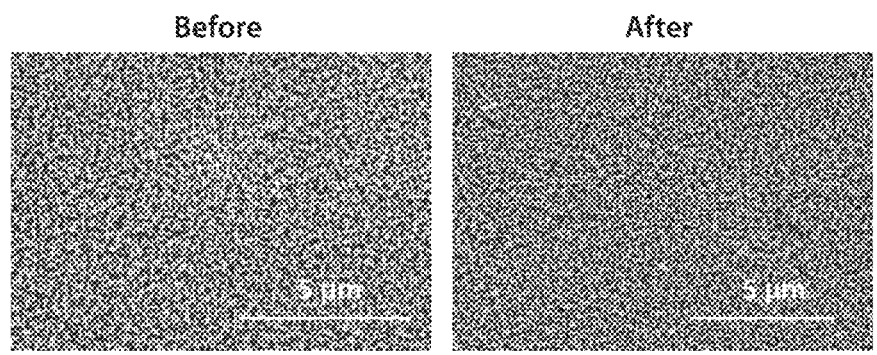

FIG. 17 shows scanning electron microscope (SEM) images of NWs before and after shear flow with a flow rate of 2 gpm.

Figure 18:
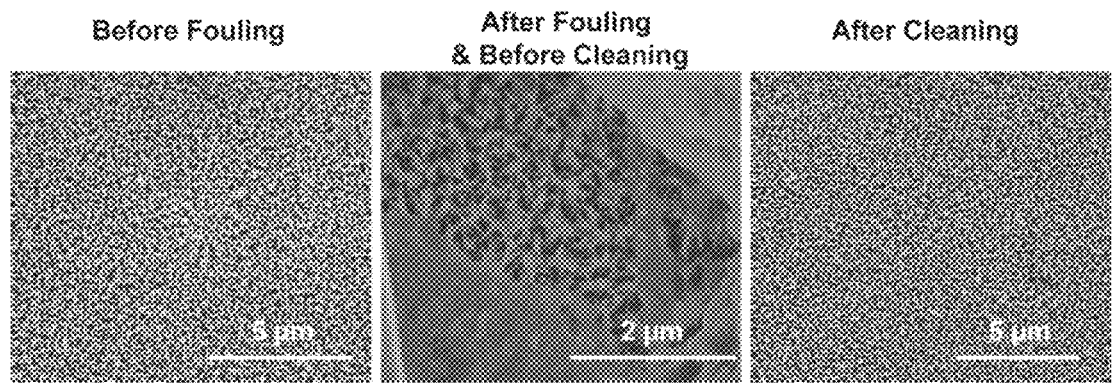

FIG. 18 shows SEM images of NWs before fouling, after fouling and before cleaning, and after cleaning.

Figure 19A:
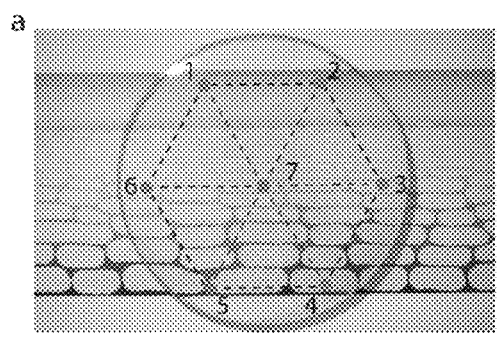
Figure 19B:
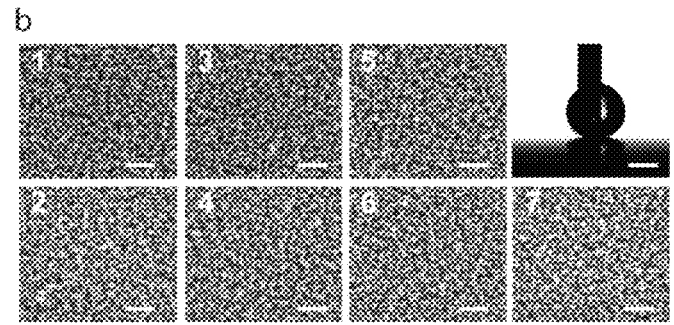

FIGS. 19A-19B show the fabrication and characterization of NW growth on curved surfaces. (19A) Optical photograph demonstrating the transparency of the NW-coated watch glass (diameter: 70 mm). The background is a postcard with the painting of Sky Above Clouds IV, 1965 from Georgia O'Keeffe. (19B) SEM images showed NW growth on 7 different points on the watch glass. The optical image of a water droplet (~5 μL) sitting on the top center of the superhydrophobic watch glass. The scale bars for all SEM images are 500 nm, and the scale bar to the optical image of the droplet is 5 mm.

Figures 20A, 20B:
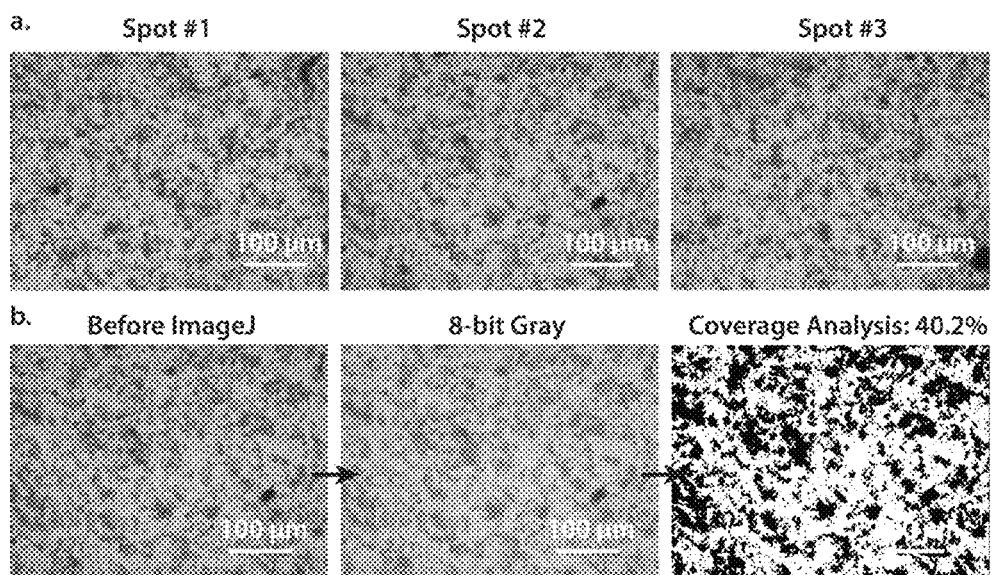

FIGS. 20A-20B show the microscopic image analyses for marine algal fouling test. (20A) Microscopic images at three different measurement spots on the sample after 20 days of fouling. (20B) Image analysis on the microscopic image to obtain the coverage fraction information of the biofouling.

Figure 21A:
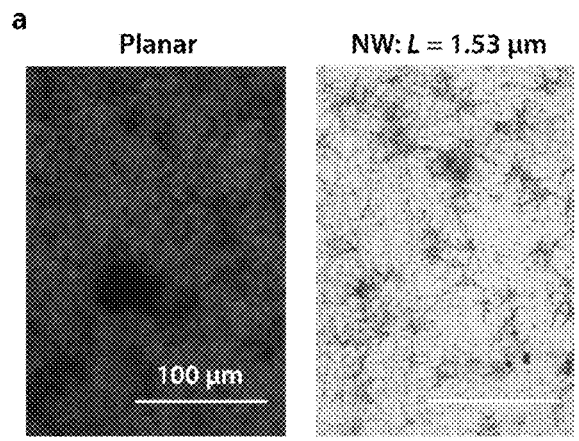
Figure 21B:
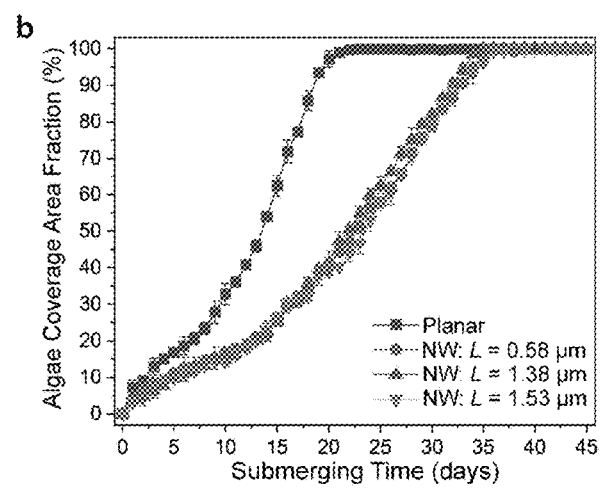

FIGS. 21A-21B show marine algae fouling performance on hydrophilic NWs with different length in a low concentration algae environment. FIG. 21A shows microscopic images on NW surfaces in the Wenzel state after 20 days algae fouling. FIG. 21B is an algae coverage area ratio on NWs with different lengths in the Wenzel state for 45 days.

Figures 22A, 22B, 22C, 22D, 22E, 22F:
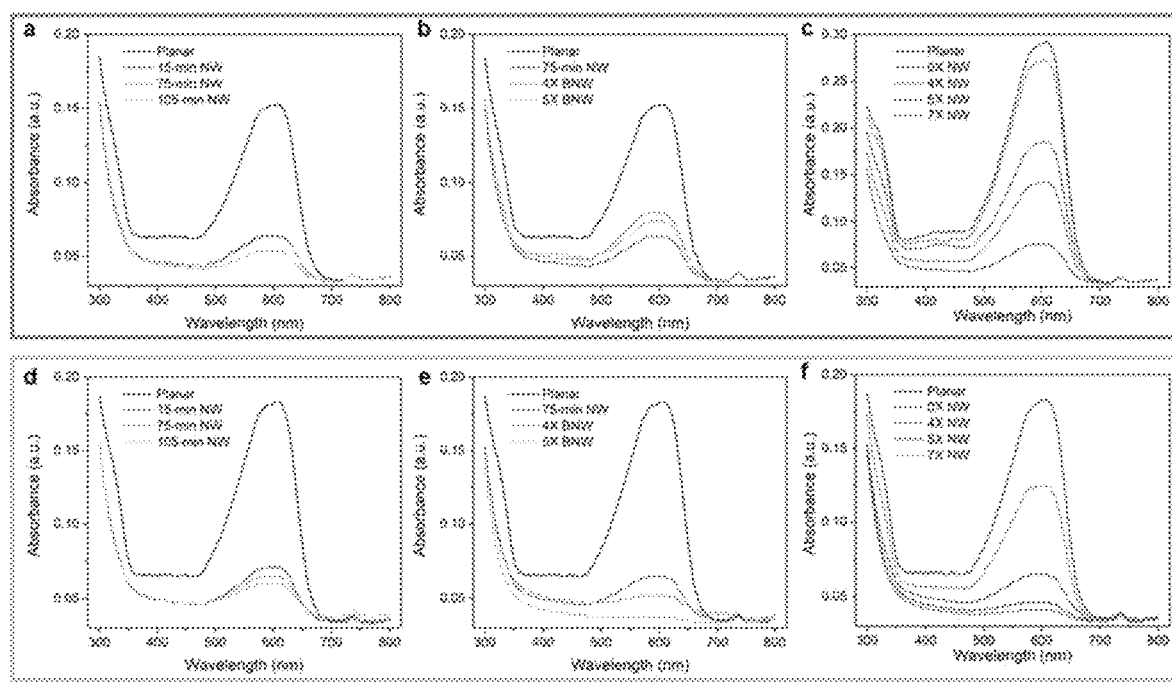

FIG. 22A-22F show the optical density of NWs with different geometries and chemistry after 20 days of algal fouling. FIGS. 22A-22C show optical density measurements (i.e., absorbance) on hydrophilic NWs and planar control after 20 days of algal fouling. FIGS. 22D-22F show optical density measurements (i.e., absorbance) on hydrophobic NWs and planar control after 20 days of algal fouling.

Figure 23:
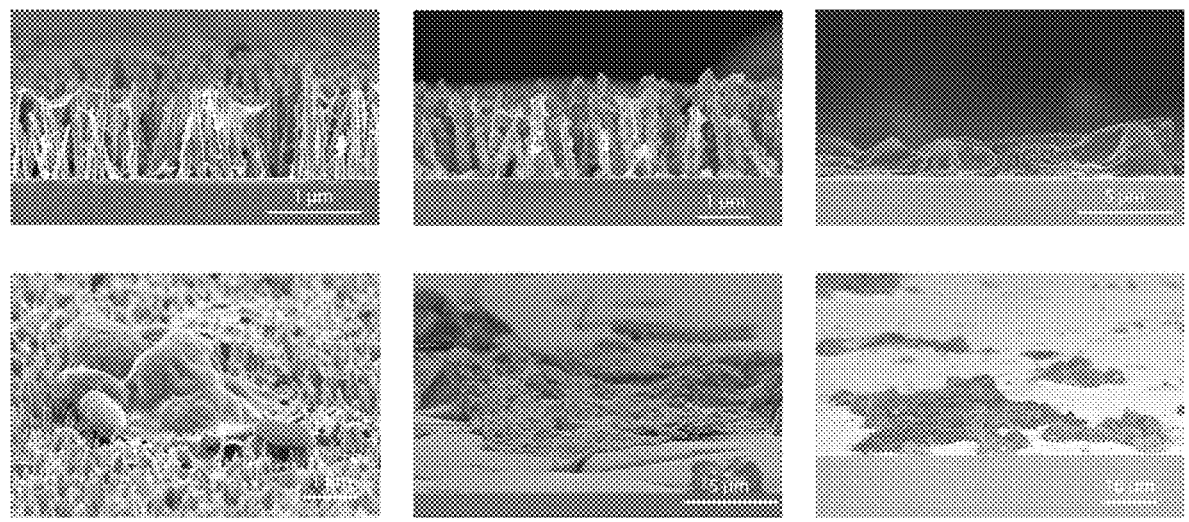

FIG. 23 shows SEM images of algal fouling on different testing samples after 2 days of algal fouling.

Figure 24:
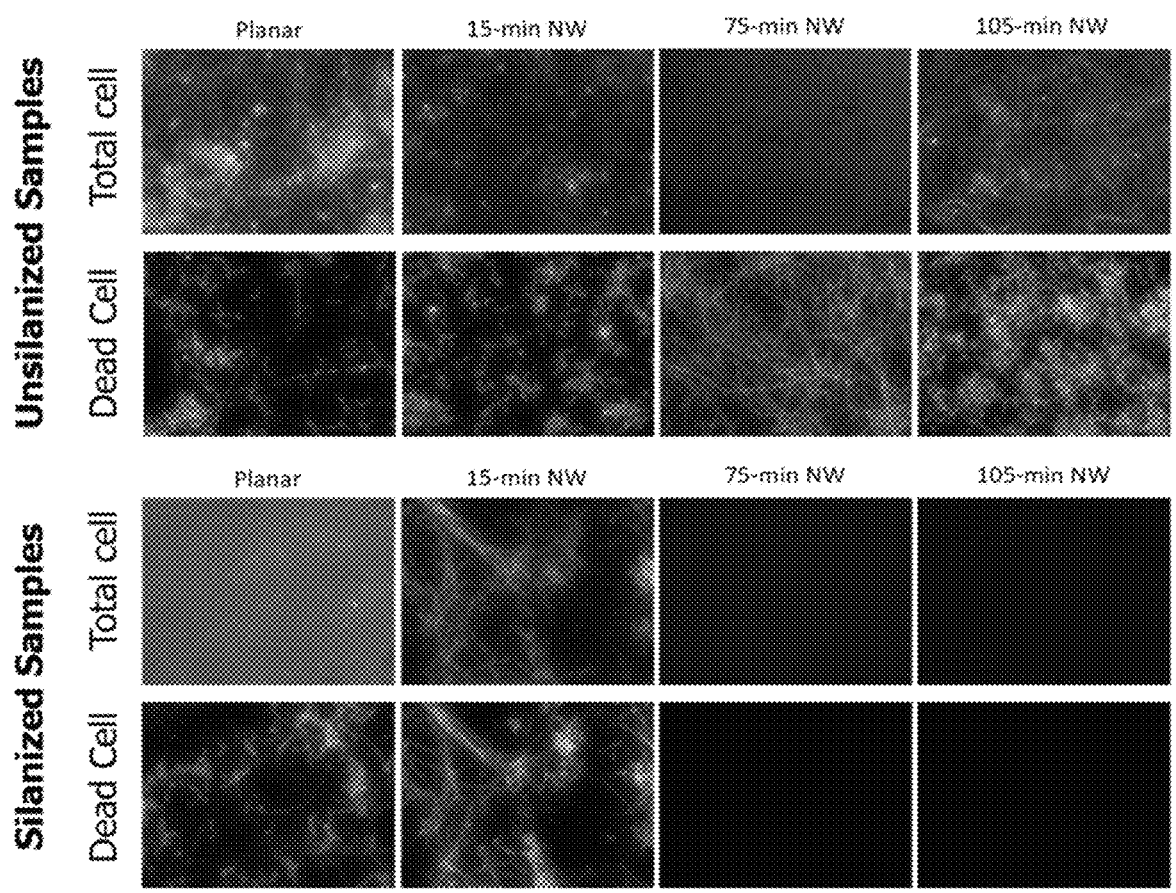

FIG. 24 shows fluorescent microscope images on NWs with different length after 5 days of algal fouling.

Figure 25:
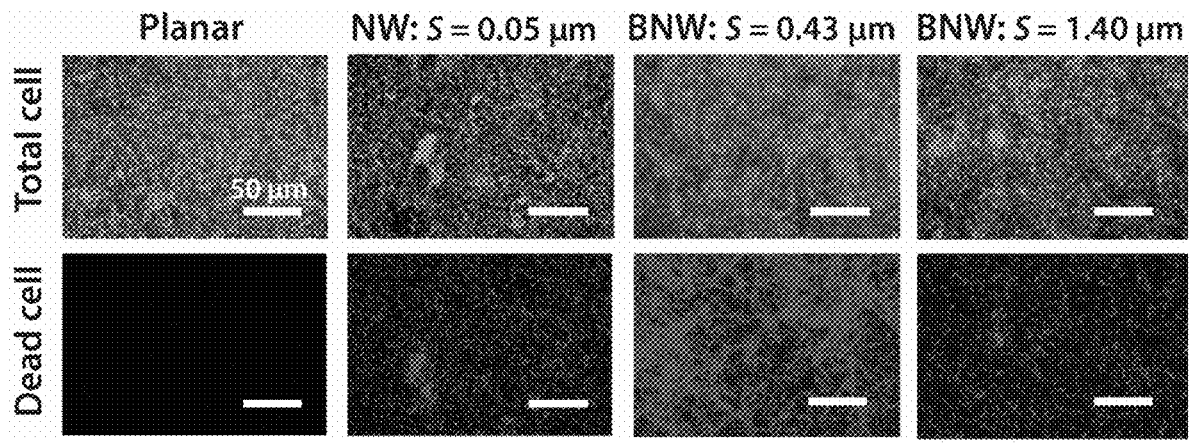

FIG. 25 shows fluorescent microscope images on NWs with branching after 5 days of algal fouling.

Figure 26:
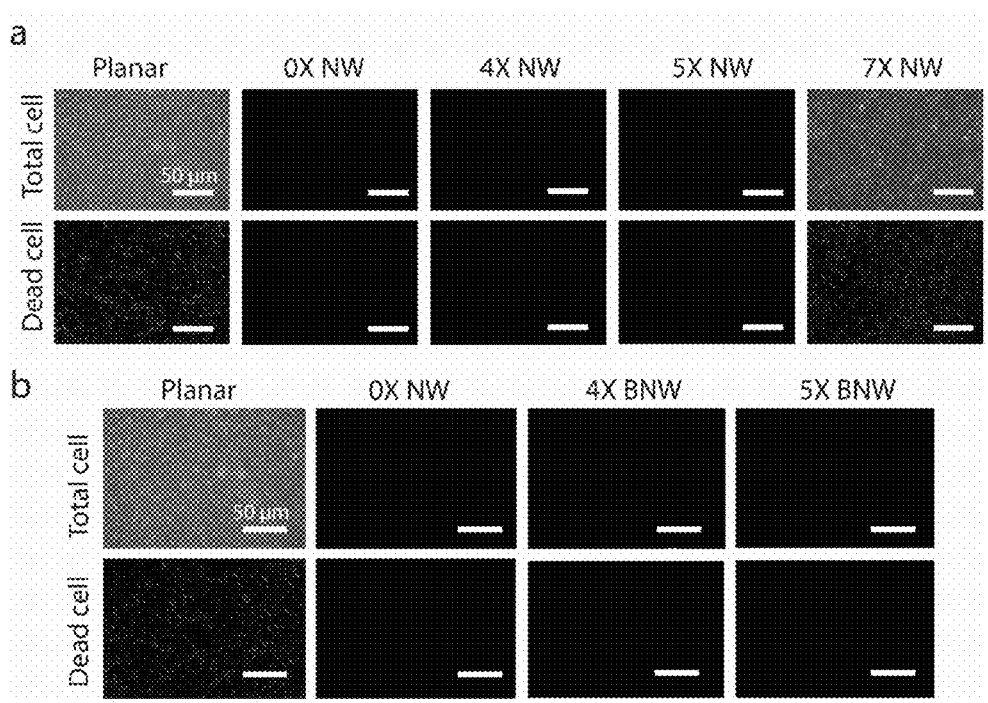

FIG. 26 shows fluorescent microscopic images of hydrophobic NWs with different spacing and branching after 5 days of algal fouling.

Figure 27:
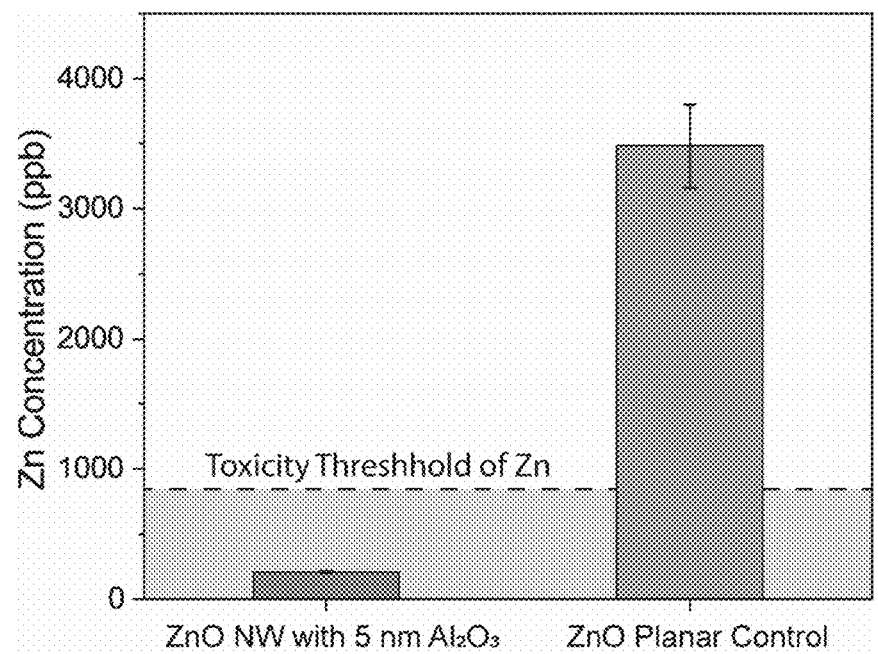

FIG. 27 is a Zn ion concentration measurement by ICP-MS. The 5-nm $Al_2O_3$ overcoat protected the ZnO NWs from dissolving into the solution compared to the planar control without the $Al_2O_3$ overcoat.

Figure 28A:
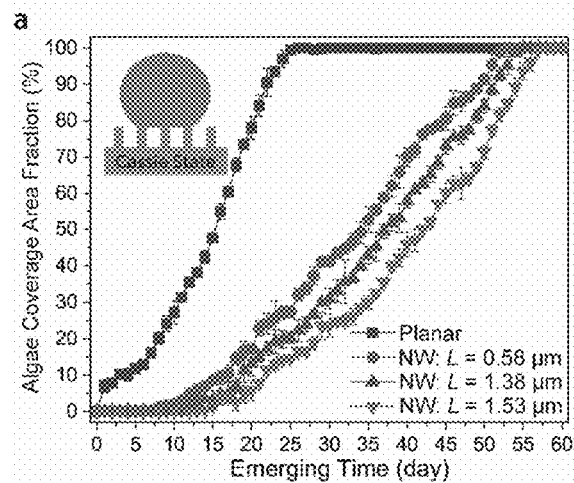
Figure 28B:
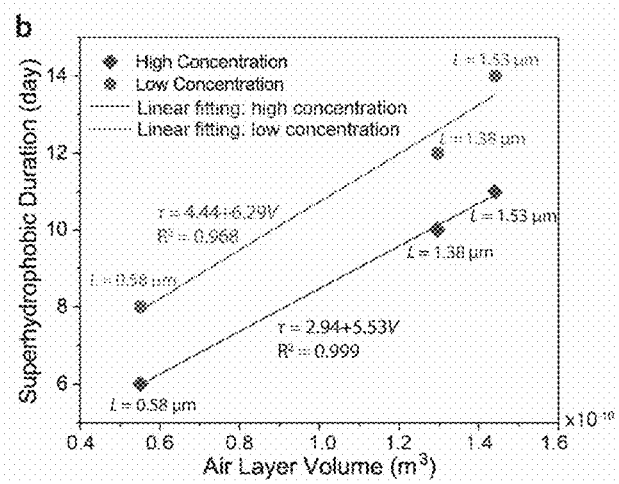

FIGS. 28A-28B shows algal fouling on NWs with different lengths under different environmental conditions. FIG. 28A is an algae coverage area fraction measurement on NWs with different length in Cassie state for 60 days. Errors bars were obtained from at least 3 independent measurements. FIG. 28B is a linear fitting of superhydrophobic duration vs air layer volume with different NW length and under different conditions.

Figure 29:
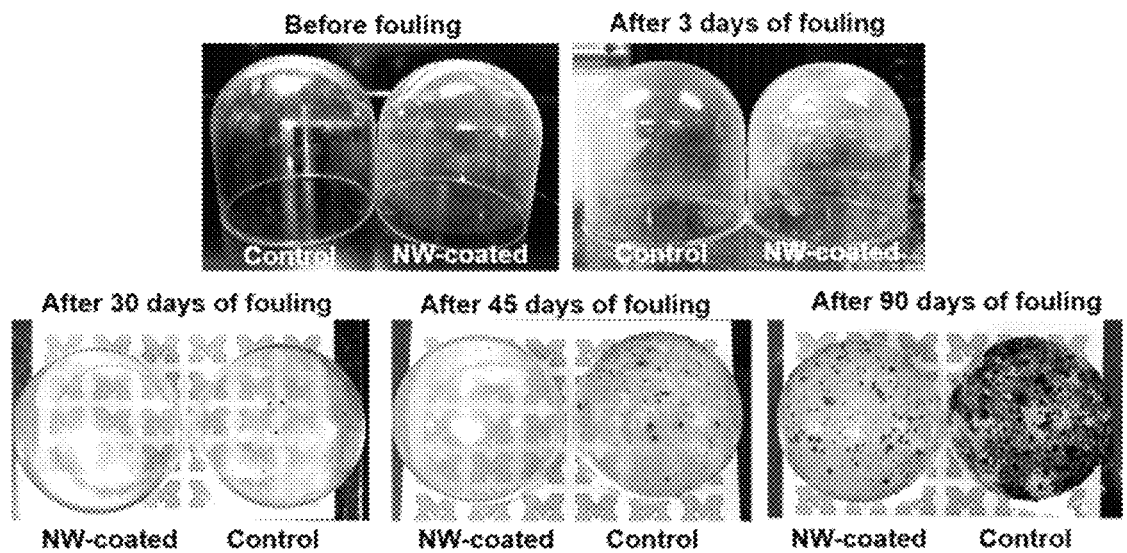

FIG. 29 shows the comparison photos between control glass dome and NW-coated glass dome before and after marine algae fouling. The glass domes were submerged into 1.5 L of solution with 30 grams of marine algae biofilms. The curved surface was facing up towards a light source. The top of the glass dome was with 10 mm depth and the bottom was with 110 mm.

Figure 30:
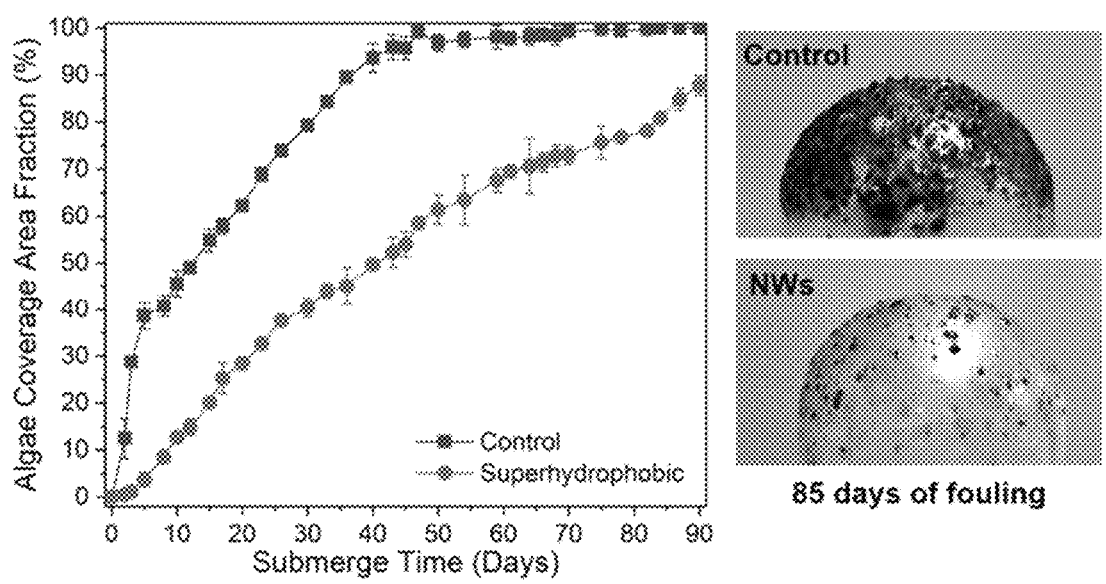

FIG. 30 shows the marine algae area coverage fraction measurement on a control glass dome and a superhydrophobic glass dome (NW-coated) through microscopic imaging and ImageJ fraction area analysis. The photos are the sideview optical images of the control dome (top) and the NW-coated dome (bottom) after 85 days of submerging in algae culture solution. The error bars were obtained from at least three independent measurements.

Corresponding reference numerals indicate corresponding parts throughout the several views of the drawings.

DETAILED DESCRIPTION

Example embodiments will now be described more fully with references to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

As discussed herein, marine biofouling is a significant global problem due to the vast diversity of fouling organisms and adhesion mechanisms that hinder a range of maritime applications. Issues associated with marine biofouling include increased fuel consumption from drag, safety concerns from corrosion, and attenuation of sensor signals. In particular, for marine optical sensors, it is critical to maintain transparency for anti-marine biofouling on surfaces, which prevents the use of common anti-fouling paints.

To overcome these challenges, surface micro/nano structures have attracted significant recent attention. This in part is because numerous marine species (e.g., shark skin, crab eyes, seashell) have evolved to adopt surface micro/nano structures for anti-marine-fouling. Inspired by these marine species, structures with characteristic length-scales ranging from micrometers to millimeters, have been designed and fabricated for reducing marine-fouling, and tested under both single-species (e.g., Ulva spores, marine diatoms, barnacle larva) and multi-species (e.g., field tests in the ocean) environments. Additionally, nano-scale surface structures (ranging from <100 nm to few hundred nanometers) have been explored for antibacterial applications. However, examples of marine biofouling that tune surface architectures with characteristic length-scales that span from below 100 nm to above 10 μm are generally lacking.

One of the challenges that has limited systematic studies of marine biofouling at these length-scales is the limitation of nano-fabrication processes that can enable systematic geometric tunability on a variety of non-planar substrates in a scalable manner. Most current fabrication methods for creating controlled nanoscale architectures depend on patterning processes (e.g., lithography), which are restricted in their substrate compatibility, scalability, and cost. In addition, it is difficult to use lithography techniques to fabricate nanostructures on complex geometries, such as curved surfaces and fabrics. Alternative patterning and deposition methods (e.g., self-assembly) provide precise control over periodic geometries; however, the ability to decouple independent geometric parameters in 3-dimensions (width, spacing, aspect ratio) can be extremely challenging for most of these techniques.

As introduced above, the principles of the present teachings provide a rational design and systematic control of nanowire architectures with tunable geometric parameters (length, spacing, branching), using in some embodiments atomic layer deposition (ALD) for surface-directed nucleation and growth of hydrothermal nanowires (NWs). The present teachings demonstrate that this approach allows for the rational design of NW architectures independent of the underlying surface geometry or composition, and can be used to tune surface wetting to enable superomniphobic surfaces by design.

According to the present teachings, the effect of surface chemistry and geometry on marine algal fouling in a multi-species environment are systematically studied for core-shell or core-shell-shell NW structures. It is shown that in some embodiments unfunctionalized NW structures can delay algal fouling for approximately 15 days, reduce the fouling coverage on the surface by up to approximately 60% after one month, and maintain optical transparency compared to the untreated surfaces. The mechanism of fouling reduction on the hydrophilic NWs can be attributed to two effects: 1) the NWs reduce the effective contact area to marine algae due to a steric hindrance to cell settlement; and 2) NWs produce a mechanical biocidal effect on the settled algae. The impact of NW geometry (length, spacing, and branching) on these effects is studied by systematic tuning of the surface architecture.

Additionally, in some embodiments, superhydrophobic NWs surfaces fabricated by functionalizing the produced NWs with a low surface energy silane demonstrated complete fouling prevention for approximately 20 days and reduced the fouling coverage for more than 50 days. The durability of the superhydrophobicity obtained on different NW architectures can be explained through thermodynamic and mass transfer analysis, and helps provide design principles for fabricating superhydrophobic anti-fouling coatings. In addition, the nanowire architectures were all transparent across the visible spectrum, demonstrating their feasibility on windows and optical surfaces. Overall, the present teachings systematically discuss and demonstrate the design of anti-biofouling NW structures with length-scales spanning from below 100 nm to greater than 10 μm.

By decoupling the impacts of NW geometry and surface chemistry, the present teachings provide new insights into the rational design of anti-marine-fouling coatings at the nanoscale.

Formulations

In some embodiments, the core-shell NW coating of the present teachings can be applied or otherwise manufactured on various substrate by the following steps:

1. 1 nm to 100 nm of ZnO layer can be formed through atomic layer deposition (ALD) using a precursor (Diethylzinc) and an oxidizer (water) at various temperature (60° C. to 220° C., typically at 150° C.).

2. Hydrothermal growth of NWs can be performed at 80-95° C. and ambient pressure for 15 min to 180 min. The substrates with ALD seed layers can be suspended facing downward in the solution to prevent the homogeneous precipitate from settling on the surface.

3. Core-shell ALD protective and functional layer ($Al_2O_3$ or $TiO_2$).
   a. approximately 5-50 nm of $Al_2O_3$ layer can be formed through atomic layer deposition (ALD) using a precursor (Trimethylaluminum) and an oxidizer (water) at various temperature (60° C. to 180° C., typically at 150° C.).
   b. >20 nm of anatase $TiO_2$ layer can be formed through atomic layer deposition (ALD) using a precursor (Tetrakis(dimethylamido)titanium) and an oxidizer (water) at various temperatures of 130-250° C. Post annealing at 200-500° C. for 1-8 hours (typically 350° C. for 4 hours) can be introduced to further form anatase $TiO_2$.

4. Surface functionalization.
   a. For ZnO—$Al_2O_3$ core-shell NWs, heptadecafluoro-1,1,2,2-tetrahydrodecyltrichlorosilane (F-17) can be used to silanize the ZnO NWs with different length, density, and hierarchy to achieve superhydrophobicity. The samples can be cleaned in oxygen plasma for approximately 10 min and maintained in a silane vapor environment at 120° C. for more than 3 hours. After the silanization process, the samples can be rinsed with toluene to remove unbonded silane.
   b. For ZnO—$TiO_2$ core-shell NWs, silicone oil (polydimethylsiloxane) with viscosity ranging from 5 cSt to 100 cSt can be used to functionalize the $TiO_2$ through UV exposure for 20 min.

Results

Fabrication of NW Surfaces

Figure 1:
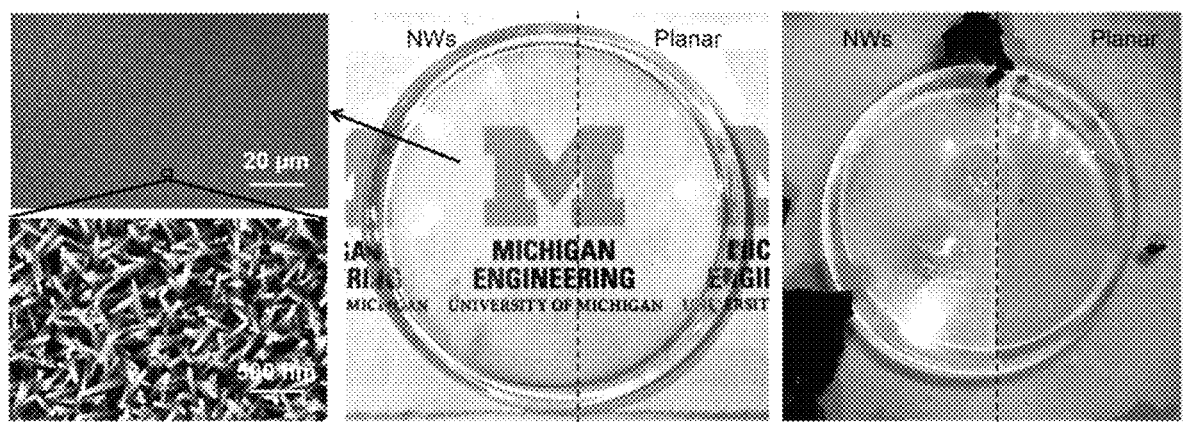
Figure 2:
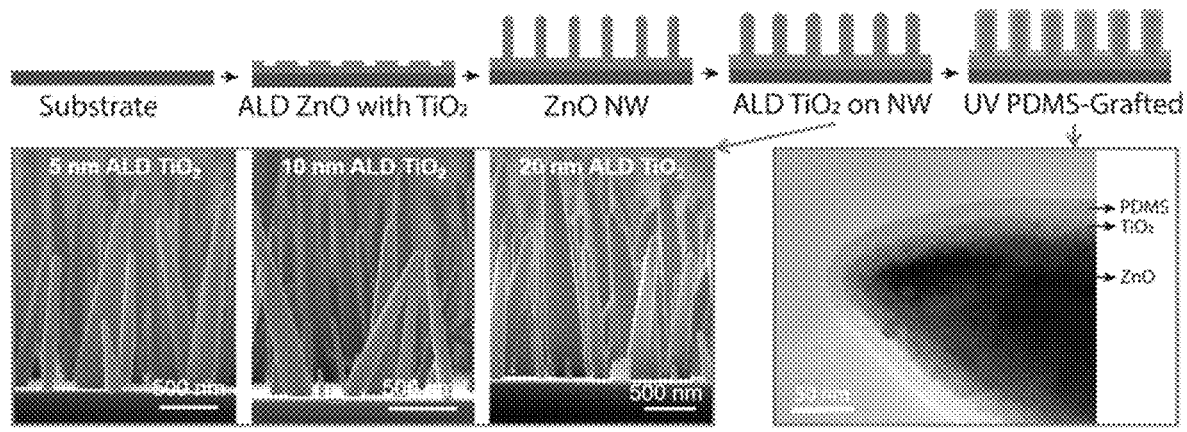
Figures 3A, 3B, 3C, 3D:
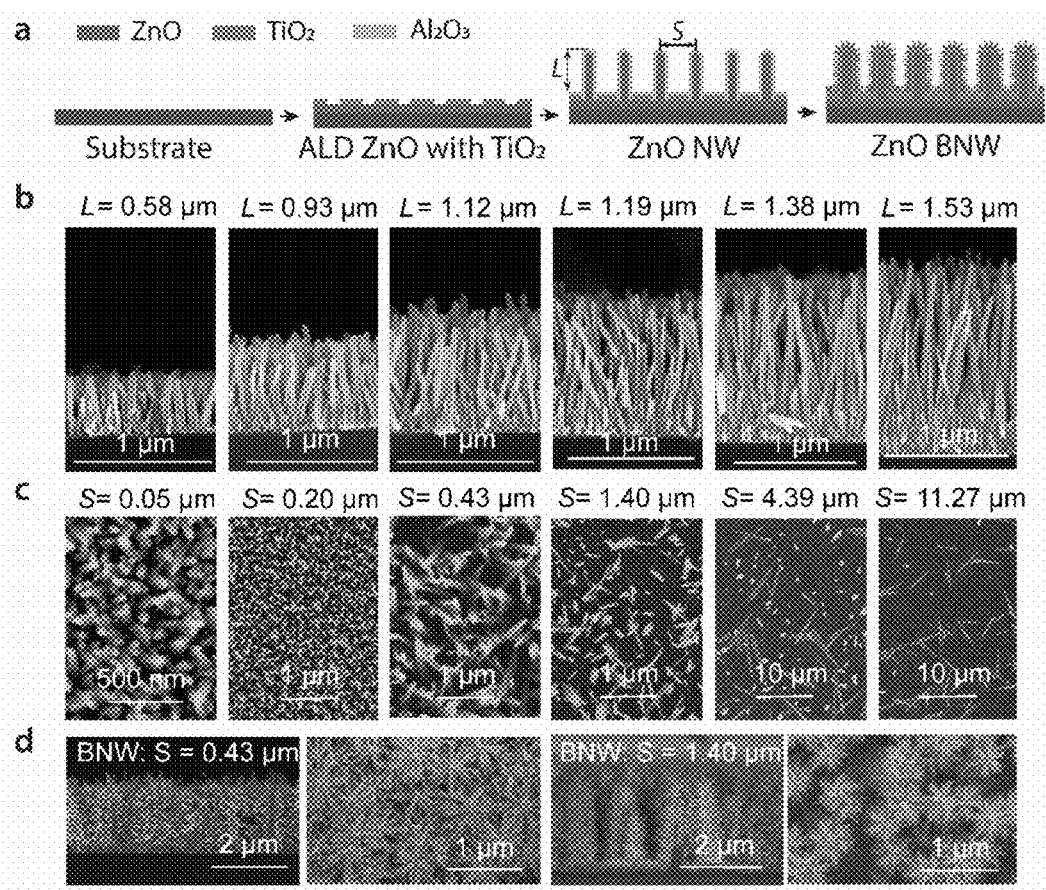
Figure 11:
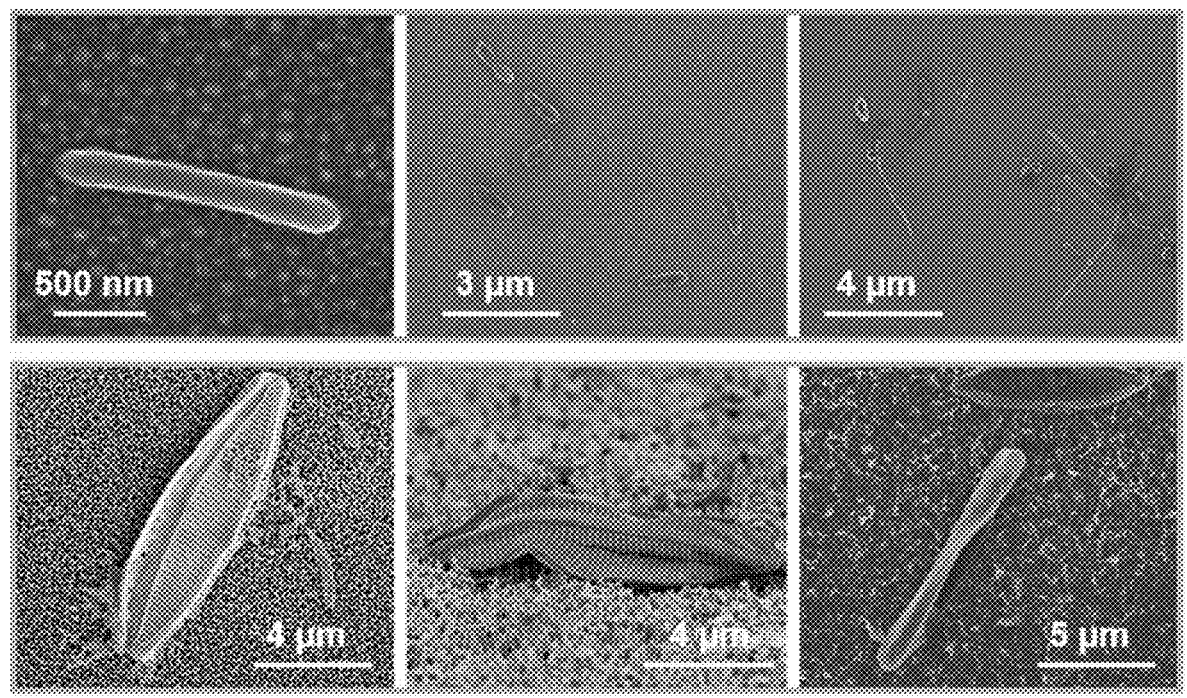

Marine algae are a complex mixture of diverse species with a characteristic size range from sub-micron to tens of micrometers (FIG. 11). Therefore, to study the impacts on marine fouling of surface textures that span these length-scales, ZnO NW arrays with tunable length, spacing, and branching were prepared using a method of surface-directed assembly that combines ALD with hydrothermal NW growth. Specifically, shown in FIG. 3A and FIGS. 12A-12C, the substrate (e.g., glass) is coated with a 20 nm seed layer of ALD ZnO, followed by a sub-monolayer "overlayer" of ALD $TiO_2$. By controlling the number of ALD $TiO_2$ cycles in this overlayer, the nucleation density of ZnO NWs can be monotonically tuned during subsequent hydrothermal growth with controlled inter-NW spacing from approximately 40 nm to >10 μm. As shown by scanning electron microscope (SEM) analysis, the length of the NWs is tuned by varying the hydrothermal growth time (FIG. 3B), and the spacing of the NWs is tuned by increasing with the number of ALD $TiO_2$ overlayer cycles (FIG. 3C). In addition to controlling NW length and spacing, branched NWs (BNW)

with controlled spacing were fabricated by a multi-step ALD-seeding/hydrothermal growth process.

Figures 12A, 12B, 12C:
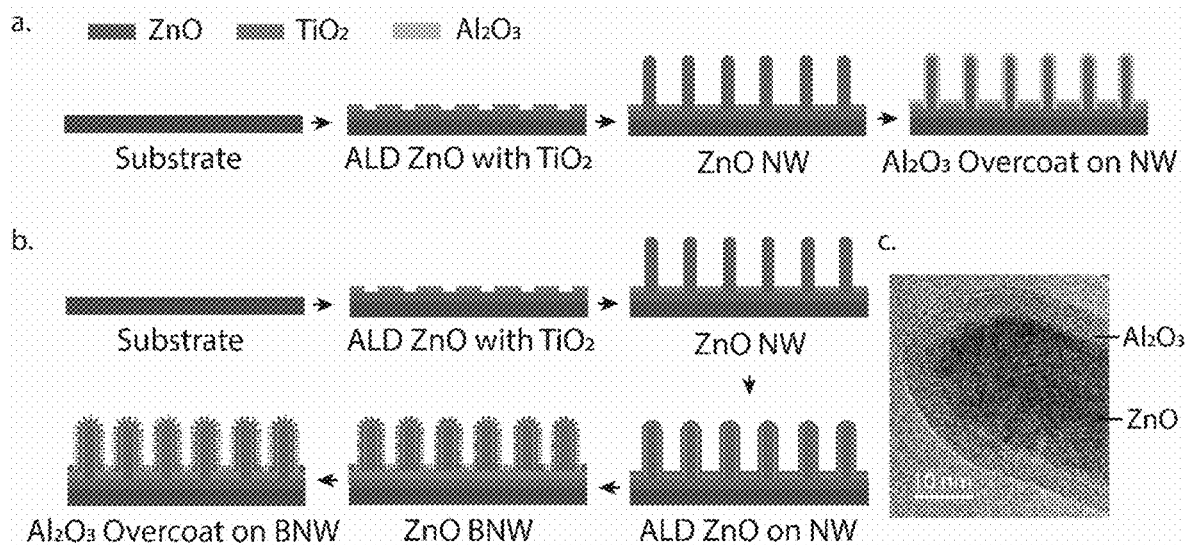

FIGS. 3A-3D shows a series of SEM images of the resulting NW and BNW morphologies to demonstrate the tunable control of the NW architecture. After the hydrothermal growth, the NWs were subsequently coated with a 5 nm $Al_2O_3$ shell to form a core-shell structure (FIG. 12C). This shell served to prevent ZnO dissolution in the aqueous environment and enable subsequent surface functionalization.

Optical Transparency Characterization

Figures 4A, 4B, 4C:
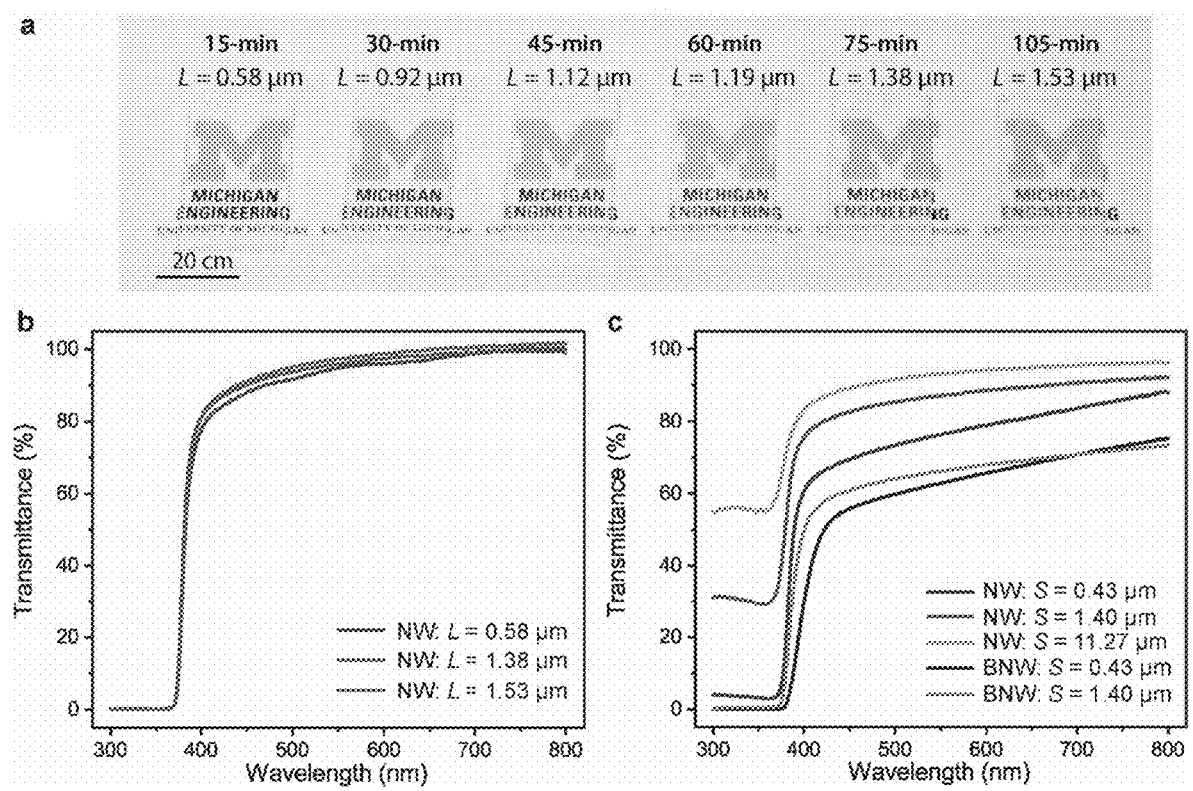
Figure 13A:
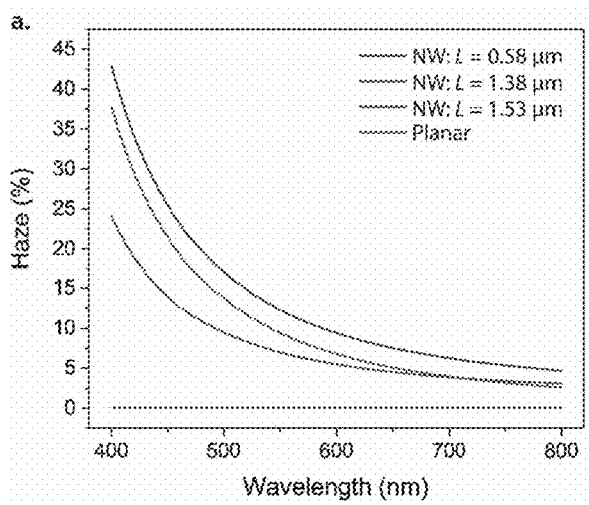
Figure 13B:
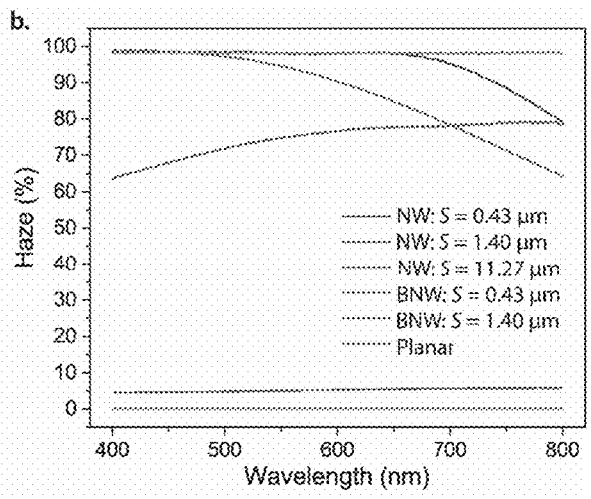

The optical transparency of the NW architectures is characterized using UV-Vis spectrophotometry. As shown in FIG. 4, all of the NW geometries were transparent across the visible spectrum, with an absorption onset in the ultraviolet region that corresponds to the bandgap of ZnO. For all of the high-density NWs (spacing <100 nm) the samples transmitted >90% of light at wavelengths above 500 nm and >80% between 400 nm and 500 nm (FIGS. 4A and 4B). The transmittance decreased with increasing inter-NW spacing, which is attributed to diffuse light scattering that results from a slight decrease in NW angle with respect to the substrate normal (FIG. 3C). Following this trend, the branched NWs (BNWs) have a transmittance larger than 60%, which is attributed to increased scattering from the branches. In addition to total transmittance, the haze of each sample is quantified to illustrate the optical clarity of the samples (FIGS. 13A-13B).

Wettability Characterization

In order to decouple the roles of surface geometry and surface functionalization on marine fouling, both hydrophilic and superhydrophobic NWs with tunable geometries are fabricated. The ALD $Al_2O_3$ shell on the NWs is intrinsically hydrophilic due to its high surface energy (approximately 900 $mJ/m^2$), as confirmed by contact angle measurements (FIG. 5B) Therefore, the wetted NWs in these hydrophilic samples were in the Wenzel state, which fully exposed the NW surfaces to the marine environment.

Figures 5A, 5B, 5C:
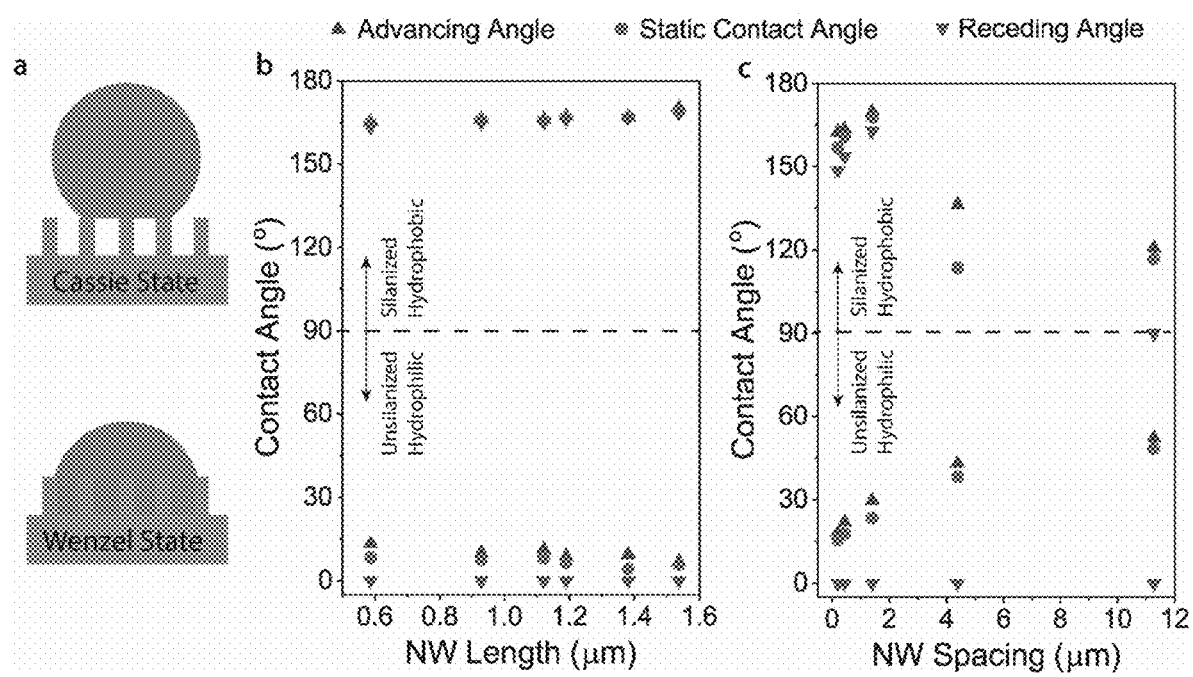
Figure 14:
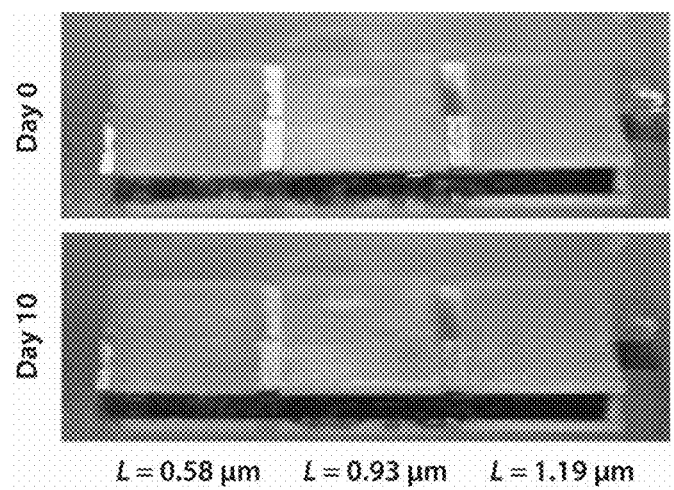
FIG. 14 shows the optical images of superhydrophobic NWs underwater with a depth of 300 mm for 10 days.
Figure 15:
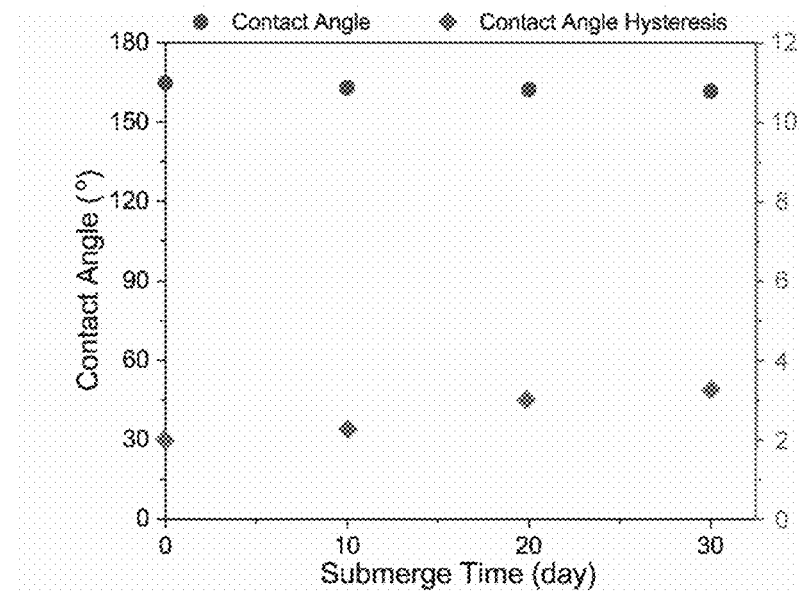
FIG. 15 shows the contact angle and contact angle hysteresis measurement on NWs submerged in synthetic seawater for 30 days.

In contrast, superhydrophobic NWs were fabricated by surface functionalization of the NWs with a perfluorinated silane (see in Method). The water repellency of the silanized NWs is confirmed through contact angle and contact angle hysteresis measurements (FIGS. 5A-5C). The silanized NWs that had small inter-NW spacings (<100 nm) and varying lengths were all superhydrophobic (FIG. 5B). The contact angle increased slightly with increasing NW length, which can be explained by a slight increase in inter-NW spacing at the tips with increasing length (FIG. 3B). As the silanized NW spacing is increased to be above approximately 3.2 µm, water is forced to wet the surface and form the Wenzel state, because the nanowires cannot provide enough Laplace pressure to hold the water droplet. Furthermore, based on the modified Furmidge equation[19], we can estimate the sliding angles from the advancing and receding angles of each surface (Table 1 and Table 2). All of the BNWs were superhydrophobic with low contact angle hysteresis (Table 3) and were also oleophobic to hexadecane (surface tension: 27 mN/m). We have previously demonstrated that these branched NWs can form superomniphobic surfaces with tunable contact angles through geometric control, which provided the motivation for their use in this study. In addition, we demonstrated that the superhydrophobic NWs are stable under hydrostatic pressure with DI water (depth: 300 mm for 10 days) (FIG. 14), long exposure to seawater (1 month) (FIG. 15) and an ambient environment (>1 year) (Table 4).

TABLE 1

| NW Samples | Advancing Angle (°) | Receding Angle (°) | Contact Angle hysteresis (°) | Calculated sliding angle (°) |
|---|---|---|---|---|
| L = 0.58 µm | 165.2 ± 0.1 | 163.3 ± 0.2 | 1.9 ± 0.2 | 0.5 ± 0.1 |
| L = 0.93 µm | 166.1 ± 0.1 | 164.8 ± 0.1 | 1.3 ± 0.1 | 0.4 ± 0.1 |
| L = 1.12 µm | 166.2 ± 0.1 | 164.9 ± 0.1 | 1.3 ± 0.1 | 0.4 ± 0.1 |
| L = 1.19 µm | 167.2 ± 0.1 | 165.9 ± 0.2 | 1.3 ± 0.2 | 0.2 ± 0.1 |
| L = 1.38 µm | 167.0 ± 0.1 | 165.9 ± 0.2 | 1.1 ± 0.2 | 0.2 ± 0.1 |
| L = 1.53 µm | 167.0 ± 0.1 | 165.9 ± 0.2 | 1.1 ± 0.2 | 0.2 ± 0.1 |

TABLE 2

| NW Samples | Advancing Angle (°) | Receding Angle (°) | Contact Angle hysteresis (°) | Calculated sliding angle (°) |
|---|---|---|---|---|
| S = 0.05 µm | 167.2 ± 0.1 | 165.9 ± 0.2 | 1.3 ± 0.2 | 0.2 ± 0.1 |
| S = 0.20 µm | 162.3 ± 0.8 | 148.6 ± 0.8 | 13.7 ± 0.8 | 6.4 ± 0.3 |
| S = 0.43 µm | 163.3 ± 0.7 | 153.5 ± 1.2 | 9.8 ± 1.0 | 4.4 ± 0.4 |
| S = 1.40 µm | 169.8 ± 0.2 | 162.7 ± 0.4 | 7.1 ± 0.4 | 1.0 ± 0.1 |
| S = 4.39 µm | 136.3 ± 0.3 | 0 | 136.3 ± 0.3 | pinned |
| S = 11.27 µm | 120.7 ± 0.3 | 89.9 ± 1.2 | 30.8 ± 1.2 | pinned |

TABLE 3

| Materials | Advancing Angle (°) | Receding Angle (°) | Contact Angle (°) |
|---|---|---|---|
| Hydrophilic BNWs (S = 0.43 µm) | 0 | 0 | 0 |
| Hydrophilic BNWs (S = 1.40 µm) | 0 | 0 | 0 |
| Hydrophobic BNWs (S = 0.43 µm) | 162.6 ± 1.0 | 160.0 ± 0.5 | 161.7 ± 0.4 |
| Hydrophobic BNWs (S = 1.40 µm) | 164.1 ± 0.6 | 161.3 ± 0.4 | 163.2 ± 0.3 |

TABLE 4

| NW Samples | Advancing Angle (°) | Receding Angle (°) | Contact Angle hysteresis (°) | Static Contact Angle (°) |
|---|---|---|---|---|
| Before | 162.6 ± 0.1 | 160.0 ± 0.3 | 2.6 ± 0.3 | 161.9 ± 0.1 |
| After | 162.1 ± 0.2 | 160.3 ± 0.4 | 1.8 ± 0.4 | 161.5 ± 0.2 |

Durability of NWs under shear flow and sonication cleaning

The NWs can withstand normal shear flow (FIG. 16 and FIG. 17, and Table 4) and strong fluid and acoustic cleaning process (FIG. 18).

Specifically, to test the durability of the NWs under shear flow, an open channel flow setup was built (FIG. 16), which generates shear forces on the surface to study fouling release. The applied shear flow could also in part simulate the shear forces experienced by surfaces when they are submerged in the ocean. Specifically, the shear flow setup can generate water flow with a flow rate up to 2 gpm. The flow rate is controlled by a throttle valve. The open channel was made of acrylic with 1-m in length ($L_c$) and 27-mm in width (w).

At the highest flow rate (2 gpm), we can calculate the required length for fully developed flow by calculating the Reynolds number (Re=4VR/v) and Froude number (Fr=V/$(gh)^{1/2}$), where R is hydraulic diameter, V is the flow velocity, v is the kinetic viscosity, g is the gravity constant, and h is the flow height. The hydraulic diameter is R=A/P, where A is the flow cross-sectional area, and P=w+2h is the wetted perimeter. For open channel flow, the length of the flow development zone (L) can be determined using the analysis described by Kirkgöz and Ardiçlioŏlu (1997):

$$L/h = 76 - 0.001 \, Re/Fr \tag{S1}$$

The wall shear on the bed of the channel can be described by the equation from Guo and Julien (2005):

$$\frac{\tau_b}{\rho g h S} = \frac{4}{\pi}\tan^{-1}\exp\left(-\frac{\pi h}{w}\right) + \frac{\pi}{4}\frac{h}{w}\exp\left(-\frac{h}{w}\right) \tag{S2}$$

where $T_b$ is the wall shear in the channel bed, p is the density, S is the slope of the channel (1:5000). The wall shear ($T_b$), the development zone (L) and all dimensionless numbers (We and Fr) are calculated as shown in Table 5. The NW geometry did not change after 1-hour exposure to the shear flow with the maximum flow rate (FIG. 16).

In addition, we performed a few experiments to evaluate the impact, and acoustic stability of NWs by cleaning the attached biofilm with a strong water jet from a squeeze bottle and exposing the sample to ultrasonication. As confirmed by scanning electron microscope (SEM) (FIG. 17) analysis, the NWs were not damaged through the processes of the attachment and subsequent detachment of biofilm, water jet cleaning (20 min), and sonication (20 min).

Moreover, we demonstrated that this fabrication method can be applied to larger length scales and to non-planar surfaces (FIG. 19).

TABLE 5

| Flow rate (m³/s) | Flow height h (m) | Re | Fr | Developed zone L (m) | Wall Shear $T_b$ (Pa) |
|---|---|---|---|---|---|
| 1.26 × 10⁻⁴ | 4.3 × 10⁻³ | 1067 | 4.94 | 0.34 | 0.35 |

Algal Fouling on Hydrophilic NWs
Algal Fouling Performance

To perform algal fouling tests, hydrophilic NWs (without silanization) as a function of geometry are first studied by submersing the samples in artificial seawater with 1-gram wet biomass of algae. The marine algae in this study were originally collected from the coast of Florida (USA), and have been previously utilized to study marine biofouling. The culture contains multiple species including cyanobacteria and diatoms (FIG. 11). The area of the surface that is covered by fouling is measured every day for 50 days using optical microscopy and ImageJ analysis (FIG. 20A-20B). As seen in the optical microscopy images (FIG. 6A) of the surfaces after 20 days fouling, all of the NW surfaces showed significant fouling reduction compared to the planar control.

Figures 6A, 6B, 6C, 6D:
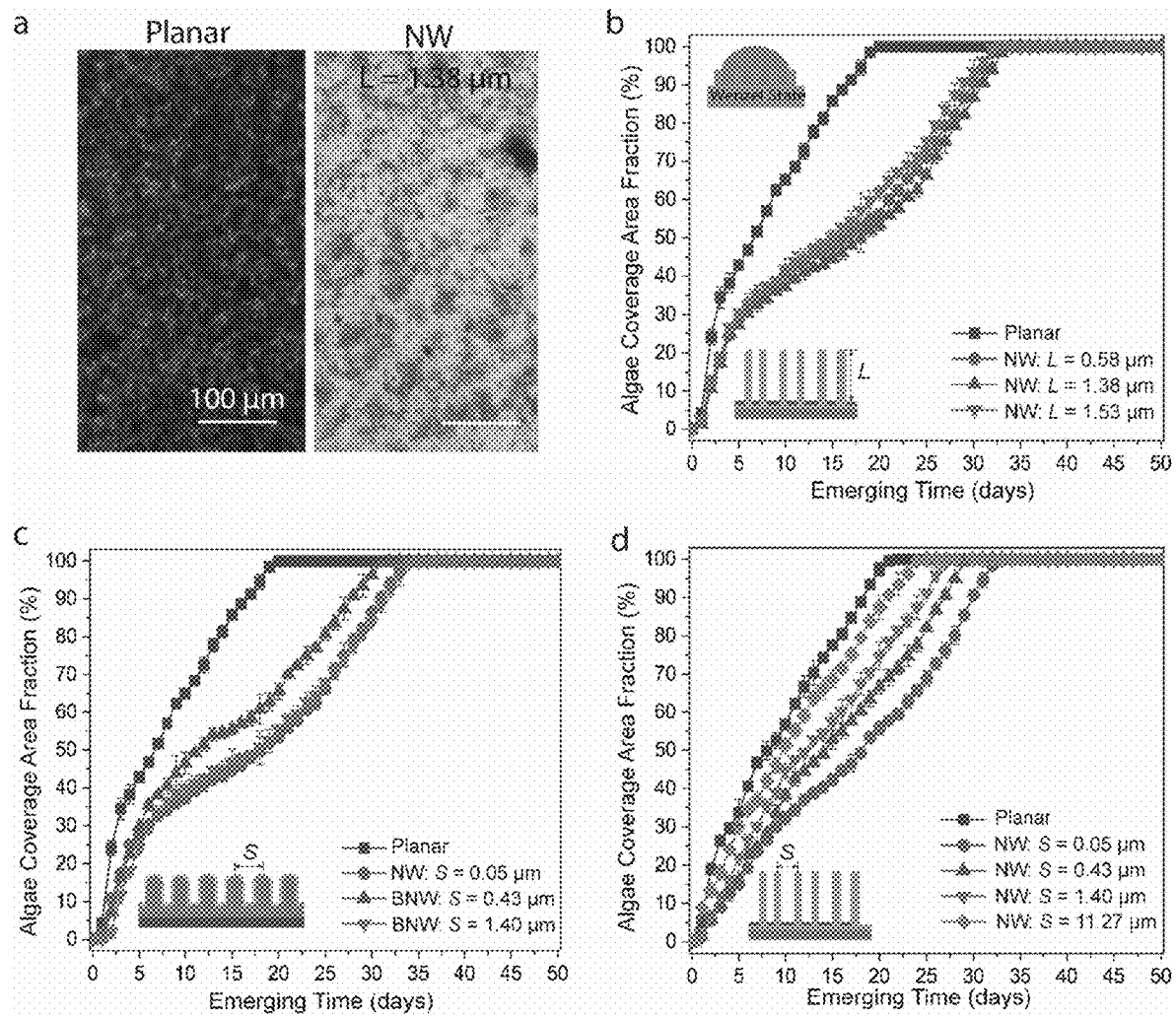

Specifically, the planar control is completely covered by fouling after approximately 20 days, while the hydrophilic NWs with different lengths and degrees of branching showed approximately 50% less coverage within the same time period (FIGS. 6B and 6C). Approximately 35 days were required for these hydrophilic NWs to be 100% covered with a biofilm, representing a delay of approximately 15 days compared to the control. From FIGS. 6B and 6C, the fouling rate on these hydrophilic samples is relatively independent of NW length and branching. In contrast, the fouling rate increased with increasing inter-NW spacing. From FIG. 6D the areal coverage is approximately 50%, approximately 65%, approximately 75%, and approximately 90% after 20 days on NWs with a spacing of 0.05±0.01 μm, 0.43±0.17 μm, 1.40±0.49 μm, and 11.27±2.02 μm, respectively. To confirm that these trends were robust in different concentrations of the marine environment, the same relative fouling rates is evaluated and observed in an environment where the initial algae concentration is reduced by 50% (FIGS. 21A-21B).

The fouling coverage area fraction is a 2-dimensional projection of a 3-dimensional film structure, which is used as a rapid and non-destructive method to measure fouling rate. To confirm that this is an accurate representation of the total extent of marine biofouling, optical density measurements were performed on the fabricated surfaces after 20-days of fouling. In these tests, a staining dye is absorbed by the cells, which is subsequently dissolved into dimethyl sulfoxide (DMSO). By measuring the optical absorbance of the dye solution, a quantitative measurement of the total volume of cells attached to the surface can be obtained. As shown in FIGS. 22A-22F, the trends observed in the optical density measurements were in agreement with the areal coverage from optical microscopy, which indicates the relative uniformity of the biofilm across the fouled area on the surface, and further validates the use of the algae coverage area fraction as a quantitative measure of fouling extent.

Fouling Reduction Mechanism on Hydrophilic NWs

The fouling reduction on the hydrophilic NWs can be attributed to two main factors: 1. Size-selective settlement of different marine species based on the inter-NW spacing; 2. A mechanical biocidal effect arising from deformation of the settled bacteria on the NW surfaces. Each of these mechanisms are discussed in further detail below.

Size-Selective Settlement Mechanism

Figures 7A, 7B, 7C:
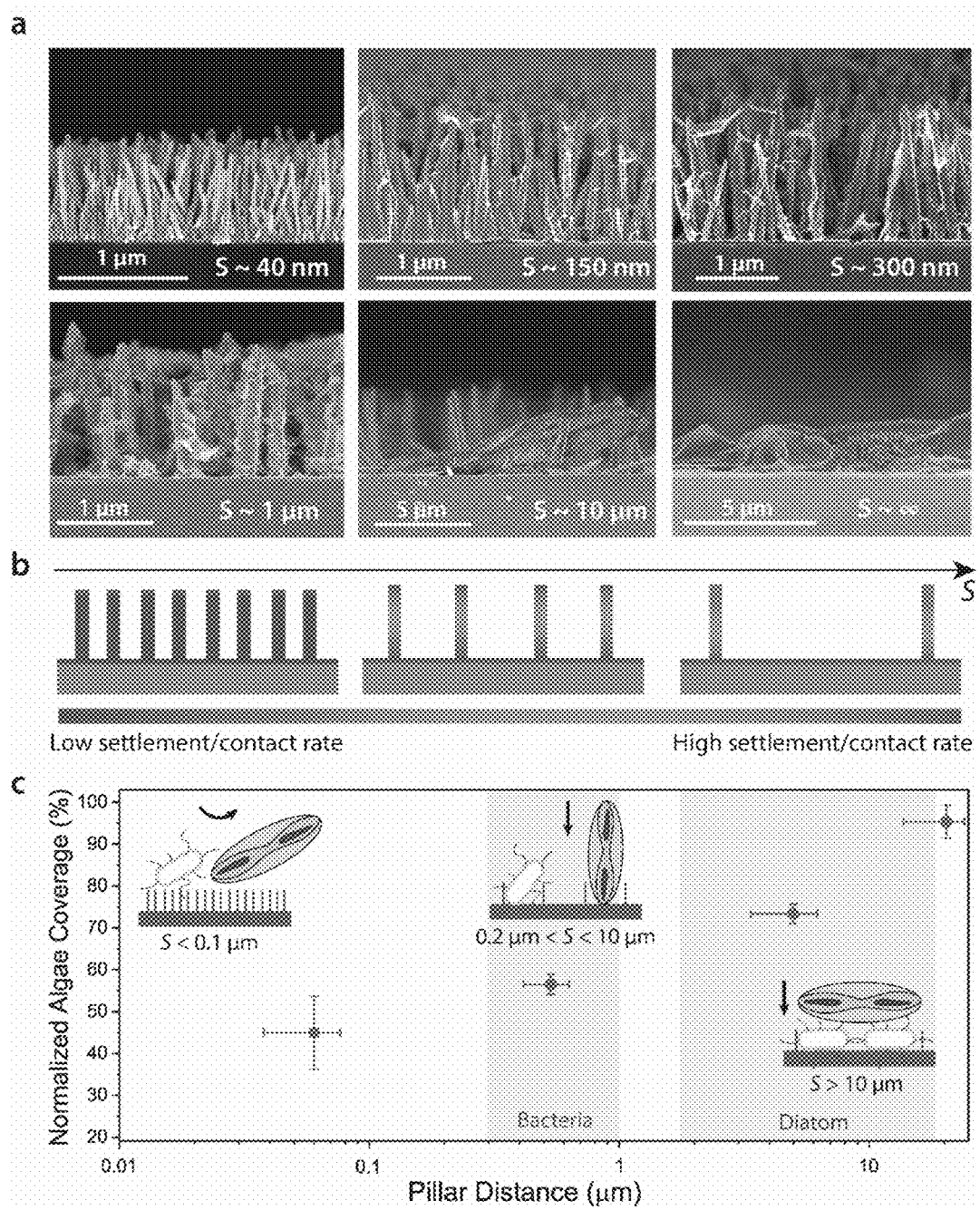

The first mechanism for the reduced fouling rate arises from the fact that NW geometry can be tuned at the characteristic length scales that match the size of the various fouling marine species (e.g. bacterial, diatoms). We observed the initial settlement of the marine algae on surfaces with different inter-NW spacings after 2-days of fouling. Cross-sectional SEM images (FIG. 7A) demonstrate that the density of algae settlement between the NWs increased with inter-NW spacing. Specifically, when the inter-NW spacing is larger than approximately 300 nm, bacteria were observed in the gaps between NWs. In contrast, for smaller inter-NW spacing, no settlement is observed between the NWs, and bacteria were only able to settle on the top surface of the NW array. We attribute this to a steric hinderance, as the smallest length-scale of bacteria observed is approximately 200 nm. Similarly, diatom settlement between the NWs is only observed when the inter-NW spacing is greater than 10 μm, which is the characteristic size of the diatoms observed according to the present teachings. Further statistical analysis of these trends at different locations along the surface are provided in the FIG. 23. These trends illustrate that the fouling species are able to access a larger fraction of the surface area for settlement as the inter-NW spacing increases (FIG. 7B).

To reconcile these initial settlement observations with the fouling coverage area results after extended time shown in FIG. 6D, the following mechanism is proposed. When the inter-NW spacing is smaller than the characteristic length scale of bacteria, the rate of settlement between the NWs is very small, and therefore, the settlement focuses at the top surfaces of the NWs. This represents a smaller effective surface area than a planar sample, since the contact points are only at the tips of the NW. As discussed in the second mechanism below, this tip-contact with the cells also leads to a mechanical bactericidal effect.

As the inter-NW spacing increases within the range of 300 nm-10 µm, the accessible surface for settlement increases, and bacteria are able to grow within the inter-NW voids. This increases the fouling rate as the inter-NW spacing increases. Eventually, as the inter-NW spacing continues to increase, a larger fraction of the underlying planar surface is available for settlement. The planar surface facilitates settlement of a more diverse range of species, including diatoms. These trends indicate that the modulation of initial settlement can have a strong impact on the longer-term bio-fouling growth rate, as shown in FIG. 7C.

Mechanical Biocidal Effect

The second mechanism for reducing the fouling rate on the NW surfaces relates to the biocidal effect that arises from mechanical interactions between the NWs and bacteria. This effect is known within the natural world; for example, dragonfly wings have strong bactericidal properties that arise from their nanostructured surfaces. These effects have been shown to be independent of surface chemical composition, demonstrating that the anti-bacterial properties of the surface arise from the geometry, rather than a material toxicity effect.

To demonstrate that the NW arrays possess similar biocidal properties, the surfaces were analyzed after 5 days of fouling test through fluorescent microscopic imaging using live/dead bacteria stains. In FIG. 8A, an increased fluorescence signal is observed from total-cell dye (fluorescent color: green) as inter-NW spacing increases. This is consistent with the trends shown in FIG. 6D, wherein the fouling rate increases with increasing inter-NW spacing. Furthermore, the fraction of total cells that are dead (fluorescent color: red) decreases as inter-NW spacing increases. Similar trends are observed in the hydrophilic NW samples with different NW lengths and degrees of branching (FIGS. 22A and 25). This indicates that as the inter-NW spacing decreases, a mechanical biocidal effect occurs similar to naturally nanostructured anti-bacterial surfaces. This leads to the death of the initial bacteria that settle on the closely-packed NW surfaces, and slows the subsequent bio-film growth kinetics.

To confirm that this biocidal effect is purely a geometric effect and not caused by Zn-ion dissolution into the aqueous solution, inductively coupled plasma mass spectrometry (ICP-MS) measurements is performed (FIG. 27). Owing to the presence of the $Al_2O_3$ shell on the NW surfaces, the concentration of Zn ions in the solution is found to be well below the toxicity level for marine algae. Therefore, the physical geometry, rather than the chemical composition of the NWs, leads to their anti-bacterial properties.

These results on the mechanical toxicity of the fabricated NWs towards marine algae are consistent with previous studies on the anti-bacterial properties of other nanoscale surface architectures (e.g., black silicon and graphite). Mechanical biocidal effects have been attributed to multiple mechanisms, for example, mechanical penetration of the cells, destructive extraction, and storage and release of mechanical energy. It is clear that the rational design of hydrophilic NW architectures can be used to tune size-selective settlement and mechanical interactions during the initial settlement, which can both contribute to improved anti-fouling performance.

Algal Fouling on Superhydrophobic NWs
Algal Fouling Performance

Figures 9A, 9B, 9C, 9D:
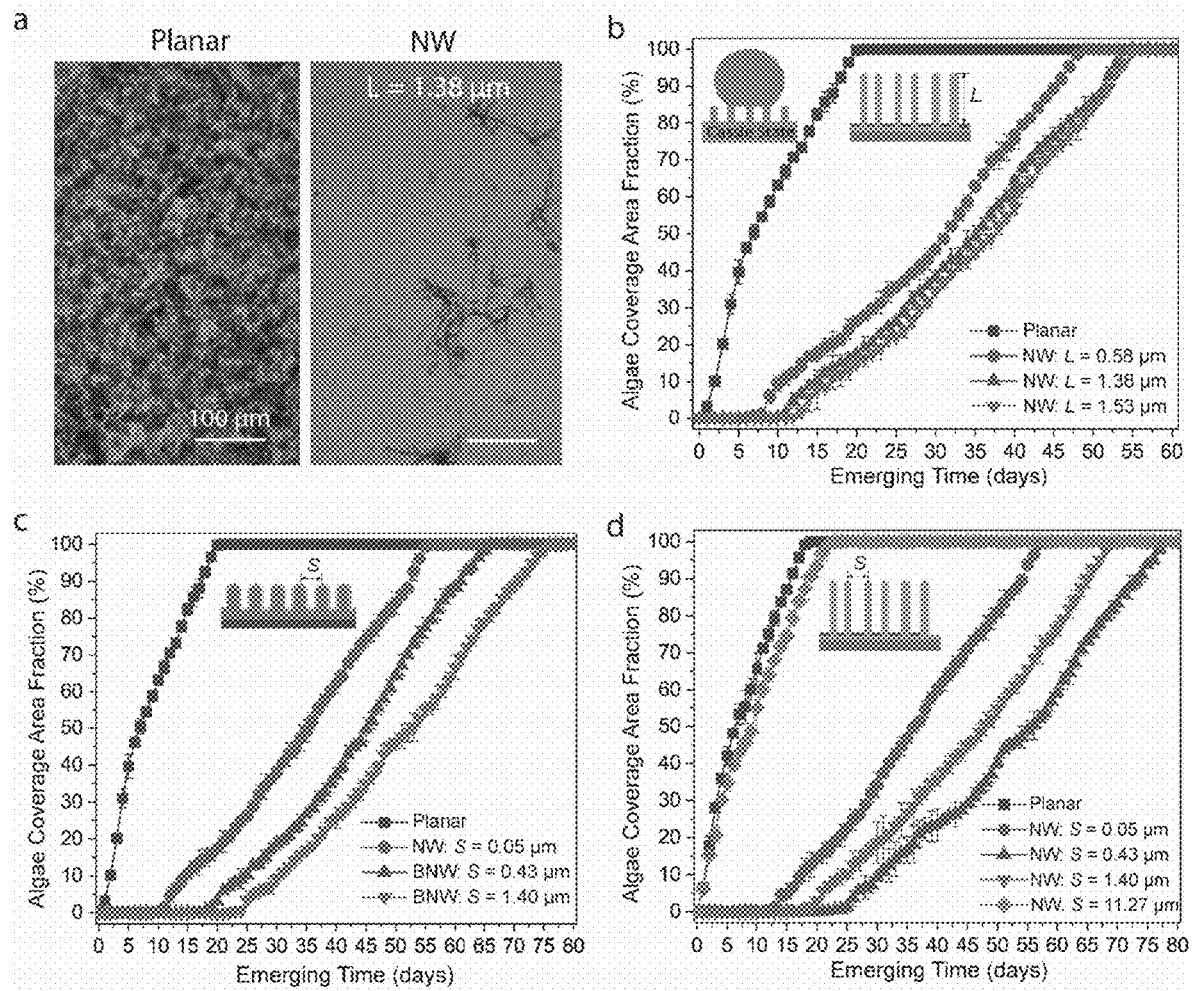

To study the effect of surface wettability on marine fouling, superhydrophobic NWs were functionalized by silanization and tested under the same marine environment (FIG. 9A). For high-density superhydrophobic NWs with varying lengths, fouling is completely prevented for 7-12 days, and the time to reach 100% area coverage is delayed by 28-35 days compared to the planar control (see in FIG. 9B). An increase in the length of NWs resulted in a monotonic increase in the duration of the Cassie state underwater, as shown in the increased time before the onset of fouling.

Furthermore, unlike the branched NWs (BNWs) in Wenzel state (FIG. 8C), the BNWs in the Cassie state exhibited an increased duration in fouling prevention compared to unbranched NWs (FIG. 9C). Specifically, the BNWs remained un-fouled for 17-22 days, and it took over 50 days before full algal areal coverage is observed on these surfaces (see in FIG. 9C).

The fouling performance of the hydrophobic NWs is also observed to vary with the inter-NW spacing. Since NWs with a spacing of 11.27±2.02 µm were in Wenzel state even after silanization (FIG. 5B), their fouling performance is similar to the unsilanized (hydrophilic) surfaces with the same large inter-NW spacing. This indicates changing surface chemistry alone does not have a strong effect on the NW's anti-fouling properties when wetting occurs. Similarly, the algal fouling coverage is close to the planar control (FIGS. 6D and 9D) when the inter-NW spacing is greater than 10 µm.

In contrast, when the inter-NW spacing is small enough to maintain the Cassie state, a maximal in fouling reduction as a function of NW spacing is observed. Specifically, the NWs with spacing S=0.43±0.17 µm outperformed the NWs with smaller (S=0.04±0.01 µm) and larger (S=1.40±0.49 µm) spacing. The NWs with a spacing of 0.43 µm were completely un-fouled for more than 20 days, and increased the time required to reach 100% areal fouling coverage by >50 days when compared to the planar control (FIG. 9D). As with the hydrophilic samples, optical density measurements are performed on the hydrophobic surfaces, and the results were found to be consistent with the trends measured in the 2-D areal coverage data (FIGS. 22A-22F).

Anti-Fouling Mechanism and Superhydrophobicity Duration on Submerged NWs

To confirm that fouling is completely suppressed on superhydrophobic NWs before wetting occurs, the absence of any settled marine species on the solid surfaces is demonstrated through fluorescent microscopy. All of the surface geometries were emerged in the marine algae culture solution for 5 days and then dyed with live/dead cell fluorescent dyes. As shown in FIGS. 24 and 26, NWs in the Cassie state showed no fluorescent signal, as there were no cells attached to the surface. However, the samples that were initially superhydrophobic eventually became wetted by the marine environment, and collapsed into the Wenzel state. At this point, fouling initiated.

Since the transition from the Cassie state to the Wenzel state drove the onset of fouling, the underwater duration of superhydrophobicity (i.e., the time for which the air layer remained "trapped" within the NW texture) is critical in determining the longevity of fouling prevention. In general, the underwater duration of superhydrophobicity depends on the total volume of the air layer and the hydrostatic pressure and follows Fick's law of mass transfer at the air-water interface. Specifically, the underwater duration of the air layer within the NW texture can be expressed as:

$$T = C \cdot V \cdot p^n$$

where T is the duration of the air layer, C is a constant, V is the total volume of the air layer, p is hydrostatic pressure, and n is a constant depending on water properties (e.g., surface tension, oxygen and nitrogen level, etc.) and any present contaminants (e.g., biological species, ionic concentration, organic contaminants, etc.).

Furthermore, it is known that water vaporizes at a different rate along curved air-water interfaces due to an increase in the Laplace pressure. This additional evaporation can be used to increase the stability of the gas layer when the surface pores are below a critical length (typically approximately 1 µm). Thus, overall to enhance the longevity of the superhydrophobic surfaces underwater, superhydrophobic NWs with a larger air volume and a spacing below 1 µm.

From FIGS. 10A and 28A-28B, the superhydrophobic duration under the marine algae environment increased with the increase of the air layer volume on NWs with different length and degrees of hierarchy. Specifically, when the inter-NW spacing is fixed, the superhydrophobic duration on these surfaces increases linearly with the total volume of the air layer. In addition, the superhydrophobic duration increased with an increase in inter-NW spacing, when the spacing is less than the critical length (approximately 1 µm) (FIG. 10A). This is because the air layer volume increases with the increase in inter-NW spacing, and all NWs with a spacing below 1 µm experience an enhancement in the superhydrophobicity duration as a result of the enhanced water vaporization. The vaporized water can partially replenish the air layer volume and reduce the total diffusion rate of air to water.

In contrast, when the spacing of the NWs is larger than the critical length, the superhydrophobic duration decreases (FIG. 10A). Interestingly, when the BNW architectures had a spacing between the base NWs of approximately 1.40 µm (larger than the critical length) the superhydrophobic duration still increased. We attribute this to the fact that the spacing between the NW branches remained less than 1 µm and therefore, the overall NW architectures remained in the water vaporization regime. This demonstrates the utility provided by the control of geometry at the nanoscale to tune the coupled wetting and fouling properties of superhydrophobic surfaces, and elucidates a set of design guidelines for nanostructured anti-fouling surfaces.

Haze Measurement on NW Samples

The haze measurement describes the fraction of light scattered when incident light passes through a transparent sample. Experimentally, this is accomplished by measuring the total transmittance of the NW sample ($T_s$) and the diffusion rate of both the NW sample ($DT_s$) as well as the instrument ($DT_{ins}$) using a UV-vis spectrophotometer equipped with an integrating sphere. The haze (in percentage) is then calculated using the following equation:

$$\text{Haze} = (DT_s - DT_{ins})/T_s \times 100\% \qquad (1)$$

The data in FIGS. 13A-13B show a steady increase in haze as the length of the NW increases, with the 105-min NW (approximately 1.54 µm) scattering the largest fraction of visible light. We also measured the haze of NWs with various densities and hierarchies. The NW sample with inter-NW spacing as 0.43 µm exhibited the highest haze and thus scattered most light that passed through it. The NW sample with inter-NW spacing as 11.27 µm exhibited lower haze than NW samples with inter-NW spacing as 0.43 µm and 1.40 µm from 400-800 nm. The hierarchical NWs showed close to 100% haze, indicating that surface is hazy, further showing that haze measurement is an accurate representation of the optical clarity and an important metric in evaluating the optical hindrance of anti-biofouling coatings. Therefore, the optical clarity (haze) is a stronger function of geometry than total transmittance.

Environmental Factors on Fouling Performance

In the ocean environment, the nature of marine biofouling will vary significantly with factors including geographic location, season, lighting, etc. While a comprehensive study of the impact of all these variables is beyond the scope of the present disclosure, one consequence of this environmental variables is a variation in the initial concentration of the marine species in the vicinity of the fouled surfaces. Therefore, how initial algae concentration affects the fouling behavior on various NW surfaces is further studied.

To vary the initial concentration, the mass of the wet biomass introduced to the fouling test is reduced by 50%. A greater reduction in fouling area fraction (approximately 60%) is observed on NWs in the Wenzel state under these low-concentration conditions compared to the high-concentration environment (approximately 50%) (see FIGS. 28A-28B and FIG. 6B). Furthermore, the duration of superhydrophobicity is longer for the low-concentration environment (approximately 14 days) than the high concentration (approximately 12 days; see FIG. 28). In addition, the superhydrophobic duration increases linearly with the volume of the air layer on the NWs regardless of the initial concentration. Overall, the trends were fully consistent in the low-concentration environment, which illustrates that the mechanistic understanding of the coupled geometric, wetting, and fouling behavior of the NW architectures is maintained.

Furthermore, glass domes with a diameter of ~100 mm were coated with NWs and tested in an environment with marine green algae for 90 days (FIG. 29 and FIG. 30). The microscopic algae area coverage fraction reached 80% on the control glass dome after 30 days of submersion in the algae culture solution. The macroscopic optical images taken after the same fouling time show that the surface was relatively transparent and did not show heavy algae fouling. From FIG. 29 and FIG. 30, we can observe that the optical transparency was not significantly affected when the algae coverage fraction was below 50% to 60%. For example, the NW-coated glass dome remained highly transparent after 45 days, when the algae area coverage fraction was 54%. This demonstrates the scalability of the NW manufacturing processes. The curved NW surfaces showed strong fouling reduction and remained high transparency.

According to the present teachings, nanostructured surfaces with controlled geometric parameters were fabricated and their structure-property relationships were studied on marine fouling. NW surfaces were fabricated with tunable control over their length, inter-NW spacing, and degrees of hierarchy spanning the nano-to-micro scales, and demonstrated their optical transparency.

For hydrophilic NWs, fouling reduction by up to 60% after 20 days and a time-delay of 20 days before 100% fouling coverage was observed. These anti-fouling properties were attributed to both size-selective settlement behavior and mechanical biocidal effects. For hydrophobic NWs, the non-fouling state was observed to be maintained for up to 22 days and fouling delayed by more than 50 days.

By quantifying the coupled relationships between NW geometry, surface wettability, optical transparency, and interaction with marine algae, design guidelines have been identified that are supported by thermodynamic and mass transfer principles. These insights can be used to rationally design nanostructured surfaces with anti-fouling properties for a broad range of applications, including marine fouling, biomedical devices, and the food industry.

EXPERIMENT AND METHOD

Atomic Layer Deposition. ZnO was deposited at a substrate temperature of 150° C. using diethyl zinc (DEZ) and DI water as the precursors. The ZnO deposited as a polycrystalline film with a growth rate of approximately 2.0 Å/cycle. TiO$_2$ was deposited at a substrate temperature of 175° C. using tetrakis(dimethylamido)titanium (TDMAT) and DI water as the precursors. The TiO$_2$ was amorphous with a growth rate of approximately 0.6 Å/cycle. Al$_2$O$_3$ was deposited at a substrate temperature of 150° C. using trimethylaluminum (TMA) and DI water as the precursors. The Al$_2$O$_3$ was amorphous with a growth rate of approximately 1.0 Å/cycle.

ZnO NW fabrication. The ZnO NWs were grown in a solution using the sample concentration as set forth in the inventors' previous report entitled "Rational Design Of Hyperbranched Nanowire Systems For Tunable Superomniphobic Surfaces Enabled By Atomic Layer Deposition" by Bielinski, A. R.; Boban, M.; He, Y.; Kazyak, E.; Lee, D. H.; Wang, C.; Tuteja, A.; Dasgupta, N. P. ACS nano 2016, 11 (1), 478-489, which is incorporated herein by reference. The hydrothermal growth was performed at 90° C. and ambient pressure. The substrates with ALD seed layers were suspended facing downward with angle approximately 45° in the solution to prevent the homogeneous precipitate from settling on the surface.

Surface chemistry modification. Heptadecafluoro-1,1,2,2-tetrahydrodecyltrichlorosilane (F-17) purchased from Gelest Inc. was used to silanize the ZnO NWs with different lengths, densities, and branching to achieve superhydrophobicity. 30 cycles ALD Al$_2$O$_3$ (approximately 5 nm) was deposited on the NW surface as a buffer to provide reactive sites for silanization. The samples were cleaned in oxygen plasma for 10 min and maintained in a silane vapor environment at 120° C. for more than 3 hours. After silanization process, the samples were rinsed with toluene to remove unbonded silane.

Contact Angle Measurements. Contact angle measurements were performed with a Ramé-Hart 200-F1 contact angle goniometer using the sessile drop method. DI water and hexadecane (purchased from Fisher Scientific) were used as probe liquids. Advancing and receding contact angles were obtained by measuring the angle while the liquid was slowly added to or removed from an approximately 3 µL droplet in contact with the sample and a micrometer syringe. At least five measurements were performed per sample, and the standard error was ±0.1°.

Algae Coverage Area Fraction Measurement. The area fraction was quantified with microscopic images on the samples through ImageJ analysis. The microscopic images were taken over at least 3 different locations on each of the sample surfaces. The images were converted to 8-bit gray images and analyzed using ImageJ to obtain the corresponding area coverage fractions. We show three microscopic images (FIG. 20A) at different measurement spots on the hydrophilic NW sample after 20 days of fouling. In addition, in FIG. 20B, we show the ImageJ analysis process on one of the microscopic images.

Algal Fouling Experiment. Marine green algae were raised in a fish tank at 25° C. with a standard bubbler and lighting for half-day on as a reservoir for algae biofilms. 40% of the total volume was replaced with fresh culture solution every week. 1 gram of biomass (i.e., algae biofilm) was weighted using an analytical balance with a resolution of 0.0001 gram and was introduced to a medium size petri dish (diameter: 100 mm) with 50 ml of seawater and F/2 (purchased from Amazon.com) mixture. Samples were cut into the same size (25 mm×15 mm) before fabrication and emerged into the algae culture environment after being coated with different NWs. The bench culture in petri dishes was kept at room temperature (20° C.) with lighting on for 50% of the time. 40% of the total volume (20 ml) was replace in each petri dish culture with fresh culture solution every 5 days. The hydrostatic pressure on the testing samples were kept at approximately 100 Pa.

Optical Density Measurements. All samples were emerged in the algae culture solution for 20 days and rinsed by saltwater (0.8 M NaCl) to remove unattached algae. Then the samples were submerged in dimethyl sulfoxide (DMSO from Sigma Aldrich) for 15 min to remove the chlorophyll in the algae, which would interference the signal of the Trypan blue dye. After removing the chlorophyll, the samples were gently rinsed by saltwater again and dyed with Trypan blue (from Thermal Fisher) for 15 min, followed by rinsing off the excess dye. Finally, 10 ml of DMSO was used for each sample to extract the blue dye and absorbance of the liquid was measured by UV-VIS spectrometry.

Fluorescent Microscope Imaging. The samples were all submerged in the algal culture solution for 5 days, and then were taken out and placed in a sodium chloride (NaCl) solution (0.85%) with gentle stirring for 15 min to remove the unsettled algae. A live/dead baclight bacteria dye kit (Thermofisher L7012) was used to stain the fouled samples. The mixing ratio of live/dead dye is 1:1, and the mixing ratio of dye to solution was 3 µl of dye to 1 ml of 0.85% NaCl. Then the samples were all stained with the dye solution for 15 min in dark environment. Finally, the fluorescent microscope images of each sample were taken through spinning disk confocal microscope (Olympus IX2-ZDC2) under the light with a wavelength of 480/500 nm (green) for total cells and 490/635 nm (red) for dead cells.

ICP-MS Measurements. A calibration solution was prepared to be 5 ppb, 10 ppb, and 20 ppb. The measured concentration matched well with calibrated concentration and fitted linearly with R square>0.999. The NW samples, with protective Al$_2$O$_3$ ALD overcoats ranging between approximately 5 nm and approximately 15 nm, were emerged into 2 ml of DI water for 5 days. The fouling testing environment for each sample was 50 ml. Therefore, the Zn ion concentration was concentrated for 25 times.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of forming a transparent nanowire architecture for marine anti-fouling, the method comprising:
    forming a ZnO layer upon a substrate via atomic layer deposition using a precursor and an oxidizer;
    hydrothermal growing of a plurality of nanowires upon the ZnO layer as a core layer; and
    forming a core-shell layer via atomic layer deposition on the ZnO core layer by forming an Al$_2$O$_3$ layer using a precursor and an oxidizer at a predetermined temperature.

2. The method according to claim 1 wherein the precursor is Trimethylaluminum.

3. The method according to claim 1 wherein the oxidizer is water.

4. The method according to claim 1 wherein the predetermined temperature is in the range of 60° C. to 220° C.

5. The method according to claim 1 wherein the predetermined temperature is about 150° C.

6. The method according to 1 further comprising silanizing the plurality of nanowires using heptadecafluoro-1,1,2,2-tetranydrodecyltrichlorosilane (F-17) to achieve superhydrophobicity.

7. The method according to claim 6 further comprising rising the plurality of nanowires with toluene to remove unbonded silane.

8. The method according to claim 6 wherein the silanization comprises cleaning the plurality of nanowires in oxygen plasma and maintaining in a silane vapor environment at a predetermined temperature and time.

9. The method according to claim 8 wherein the predetermined temperature and time are 120° C. and more than 3 hours respectively.

\* \* \* \* \*

UNITED STATES PATENT AND TRADEMARK OFFICE
CERTIFICATE OF CORRECTION

| | |
|---|---|
| PATENT NO. | : 11,377,734 B2 |
| APPLICATION NO. | : 17/182791 |
| DATED | : July 5, 2022 |
| INVENTOR(S) | : Neil P. Dasgupta et al. |

It is certified that error appears in the above-identified patent and that said Letters Patent is hereby corrected as shown below:

In the Claims

Column 19, Claim 6, Line 5, after "to", insert --claim--.

Signed and Sealed this
Eleventh Day of October, 2022

*Katherine Kelly Vidal*

Katherine Kelly Vidal
*Director of the United States Patent and Trademark Office*